(12) United States Patent
Hsieh et al.

(10) Patent No.: US 9,673,093 B2
(45) Date of Patent: Jun. 6, 2017

(54) SEMICONDUCTOR DEVICE AND METHOD OF MAKING WAFER LEVEL CHIP SCALE PACKAGE

(71) Applicant: STATS ChipPAC, Ltd., Singapore (SG)

(72) Inventors: Ming-Che Hsieh, Chutung (TW); Chien Chen Lee, Jhubei (TW); Baw-Ching Perng, Baoshan Township (TW)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/449,914

(22) Filed: Aug. 1, 2014

(65) Prior Publication Data
US 2015/0041985 A1   Feb. 12, 2015

Related U.S. Application Data

(60) Provisional application No. 61/862,938, filed on Aug. 6, 2013.

(51) Int. Cl.
*H01L 23/48* (2006.01)
*H01L 21/768* (2006.01)
(Continued)

(52) U.S. Cl.
CPC ...... *H01L 21/76879* (2013.01); *H01L 21/561* (2013.01); *H01L 23/3192* (2013.01);
(Continued)

(58) Field of Classification Search
CPC ......... H01L 24/05; H01L 24/16; H01L 21/78; H01L 2224/13027; H01L 2224/16237
See application file for complete search history.

(56) References Cited

U.S. PATENT DOCUMENTS

| 7,977,783 B1 * | 7/2011 | Park ................. H01L 24/11 257/692 |
| 8,222,538 B1 * | 7/2012 | Yoshida ............. H01L 23/3128 174/260 |

(Continued)

OTHER PUBLICATIONS

Hsieh, Ming-Che, "Finite Element Analyses for Critical Designs of Low Cost Wafer-Level Chip Scale Packages", IEEE Transactions on Components, Packaging and Manufacturing Technology. vol. 4, No. 3, Mar. 2014.

(Continued)

*Primary Examiner* — Allen Parker
*Assistant Examiner* — Wasiul Haider
(74) *Attorney, Agent, or Firm* — Robert D. Atkins; Patent Law Group: Atkins and Associates, P.C.

(57) ABSTRACT

A semiconductor device has a semiconductor wafer and a first conductive layer formed over the semiconductor wafer as contact pads. A first insulating layer formed over the first conductive layer. A second conductive layer including an interconnect site is formed over the first conductive layer and first insulating layer. The second conductive layer is formed as a redistribution layer. A second insulating layer is formed over the second conductive layer. An opening is formed in the second insulating layer over the interconnect site. The opening extends to the first insulating layer in an area adjacent to the interconnect site. Alternatively, the opening extends partially through the second insulating layer in an area adjacent to the interconnect site. An interconnect structure is formed within the opening over the interconnect site and over a side surface of the second conductive layer. The semiconductor wafer is singulated into individual semiconductor die.

26 Claims, 31 Drawing Sheets

(51) Int. Cl.
*H01L 23/498* (2006.01)
*H01L 23/525* (2006.01)
*H01L 23/532* (2006.01)
*H01L 21/56* (2006.01)
*H01L 23/14* (2006.01)
*H01L 23/31* (2006.01)
*H01L 23/00* (2006.01)

(52) U.S. Cl.
CPC ...... *H01L 23/49894* (2013.01); *H01L 23/525* (2013.01); *H01L 23/5329* (2013.01); *H01L 24/05* (2013.01); *H01L 24/13* (2013.01); *H01L 24/16* (2013.01); *H01L 23/145* (2013.01); *H01L 23/3114* (2013.01); *H01L 23/3171* (2013.01); *H01L 24/03* (2013.01); *H01L 24/11* (2013.01); *H01L 24/81* (2013.01); *H01L 2224/02331* (2013.01); *H01L 2224/02377* (2013.01); *H01L 2224/0345* (2013.01); *H01L 2224/0346* (2013.01); *H01L 2224/0392* (2013.01); *H01L 2224/03452* (2013.01); *H01L 2224/0401* (2013.01); *H01L 2224/05008* (2013.01); *H01L 2224/05009* (2013.01); *H01L 2224/05022* (2013.01); *H01L 2224/0558* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05186* (2013.01); *H01L 2224/05548* (2013.01); *H01L 2224/05555* (2013.01); *H01L 2224/05567* (2013.01); *H01L 2224/05571* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/1132* (2013.01); *H01L 2224/1134* (2013.01); *H01L 2224/1145* (2013.01); *H01L 2224/1146* (2013.01); *H01L 2224/11334* (2013.01); *H01L 2224/11849* (2013.01); *H01L 2224/11901* (2013.01); *H01L 2224/13005* (2013.01); *H01L 2224/13006* (2013.01); *H01L 2224/13021* (2013.01); *H01L 2224/13023* (2013.01); *H01L 2224/13024* (2013.01); *H01L 2224/13027* (2013.01); *H01L 2224/13082* (2013.01); *H01L 2224/13111* (2013.01); *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16111* (2013.01); *H01L 2224/16237* (2013.01); *H01L 2224/16238* (2013.01); *H01L 2224/16503* (2013.01); *H01L 2224/81191* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/94* (2013.01); *H01L 2924/00011* (2013.01); *H01L 2924/12042* (2013.01); *H01L 2924/13091* (2013.01)

(56) References Cited

U.S. PATENT DOCUMENTS

| | | | |
|---|---|---|---|
| 2010/0117231 A1 | 5/2010 | Lang et al. | |
| 2010/0187685 A1* | 7/2010 | Morifuji | H01L 23/3192 257/737 |
| 2011/0186995 A1 | 8/2011 | Alvarado et al. | |
| 2011/0198753 A1 | 8/2011 | Holland | |
| 2011/0266670 A1 | 11/2011 | England et al. | |
| 2013/0087908 A1* | 4/2013 | Yu | H01L 24/13 257/737 |
| 2014/0124928 A1* | 5/2014 | Lin | H01L 24/13 257/738 |

OTHER PUBLICATIONS

Hsieh, Ming-Che, "Simulations and Characterizations for Stress Reduction Designs in Wafer Level Chip Scale Packages", International Microsystems, Packaging, Assembly, Circuits Technology Confrence, 2013.

* cited by examiner

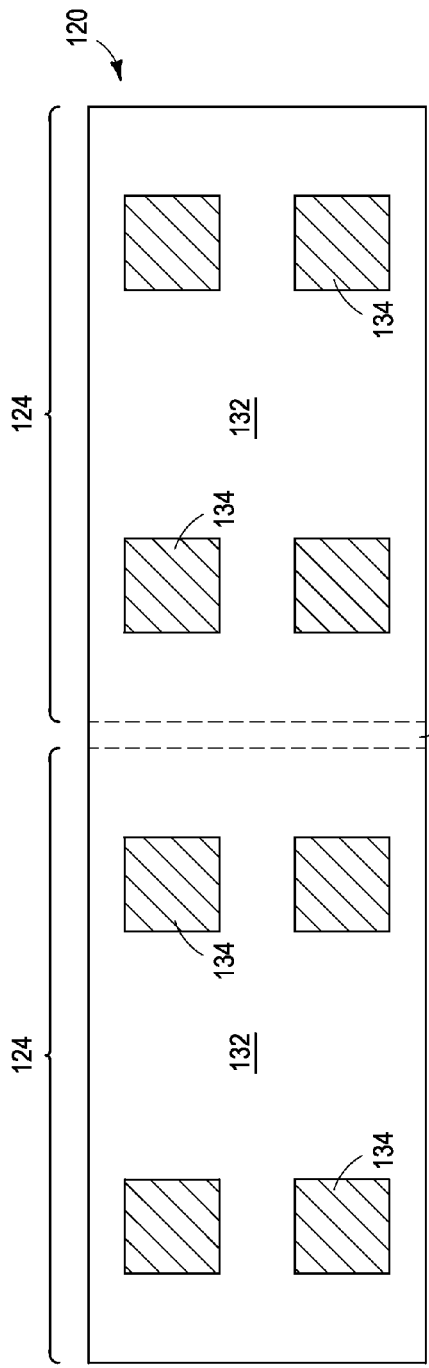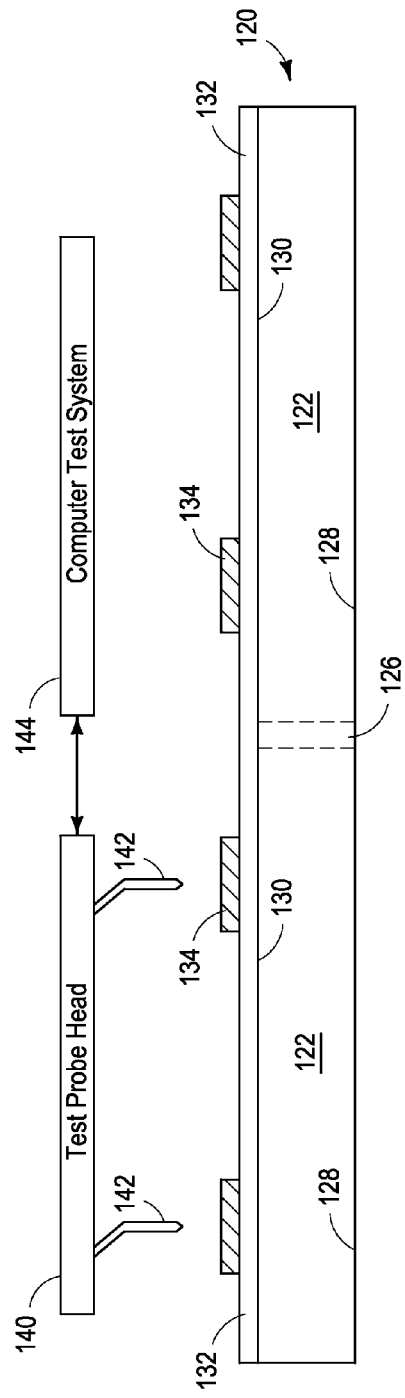

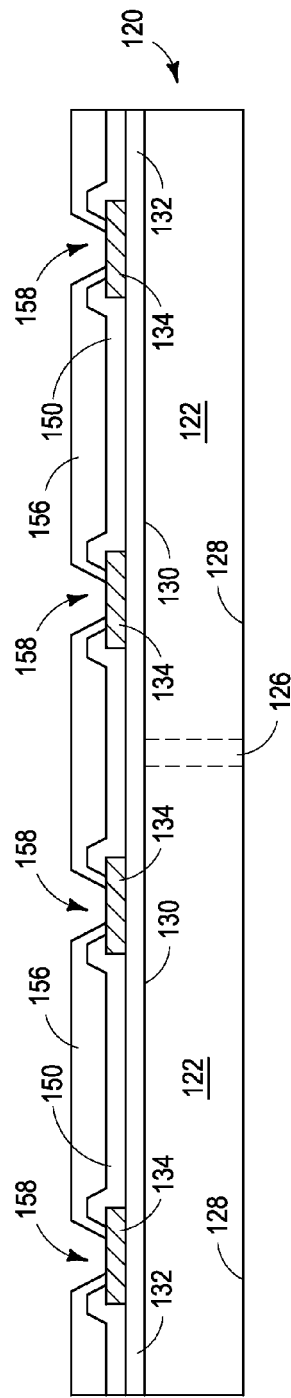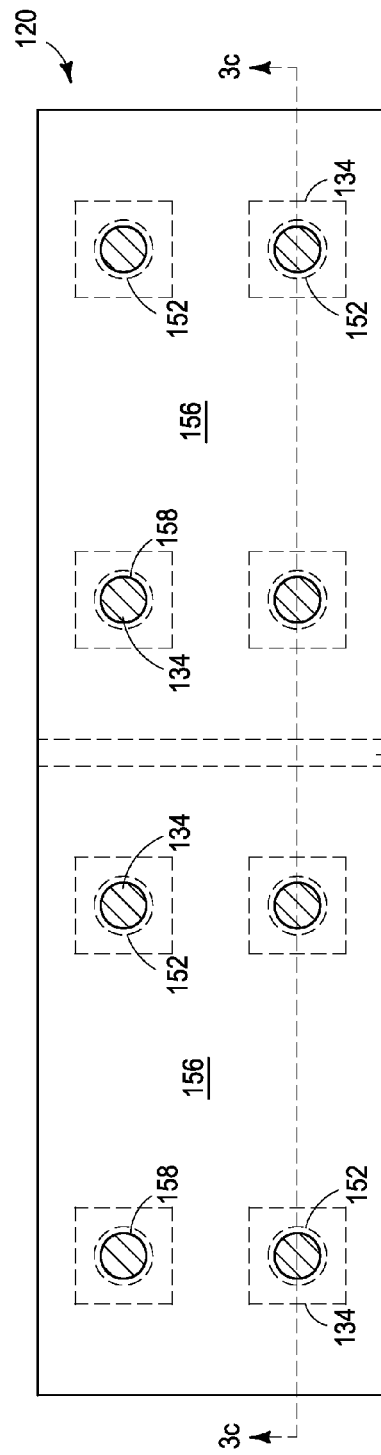
FIG. 3c
FIG. 3d

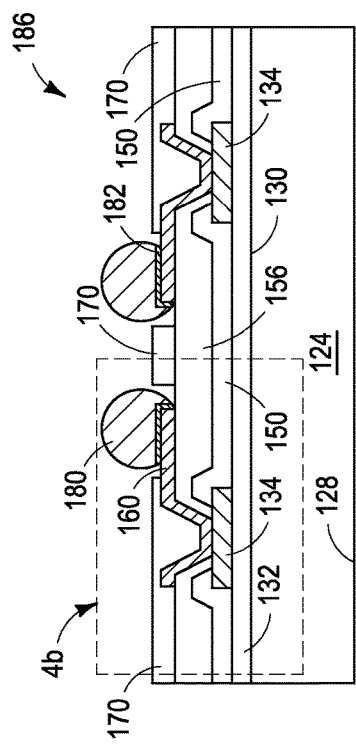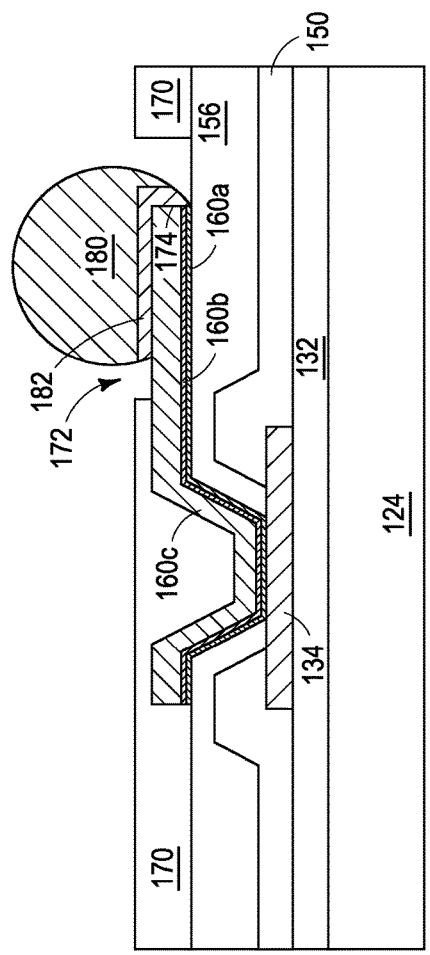
FIG. 4a
FIG. 4b

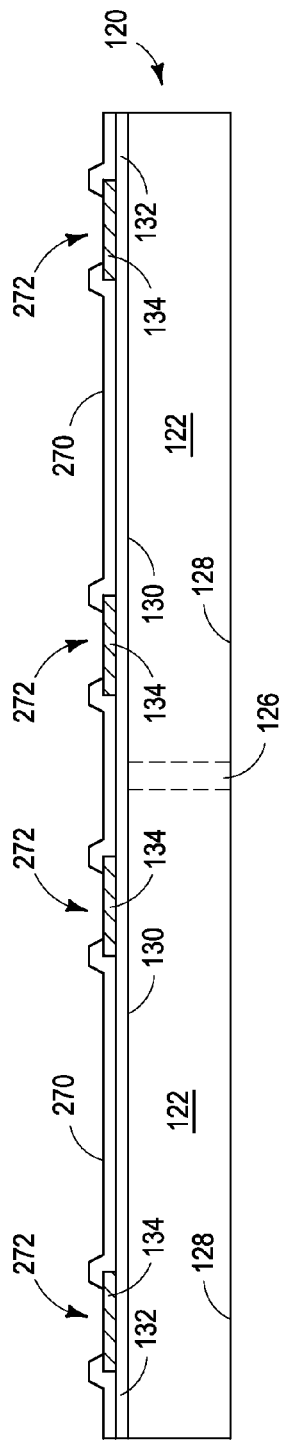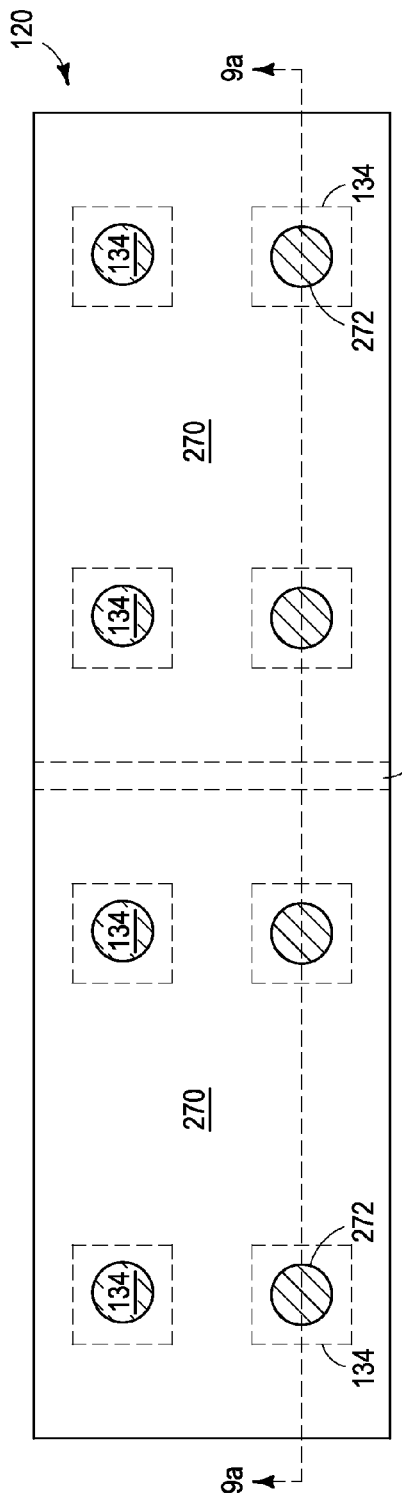
FIG. 9a
FIG. 9b

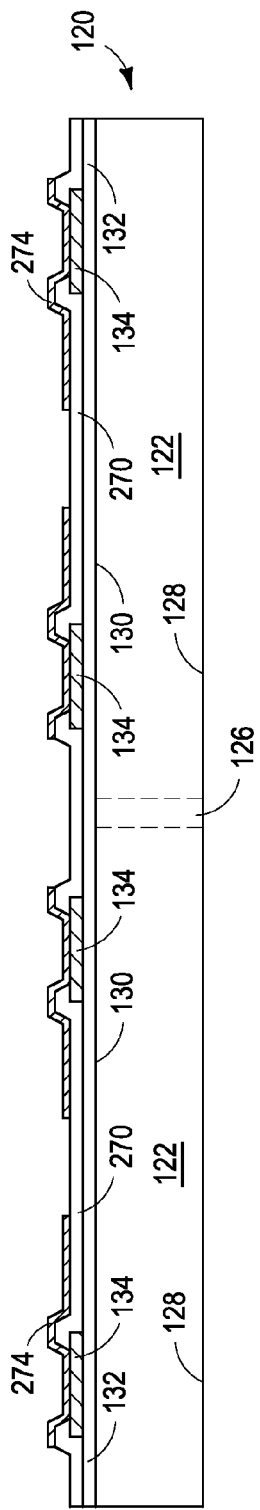
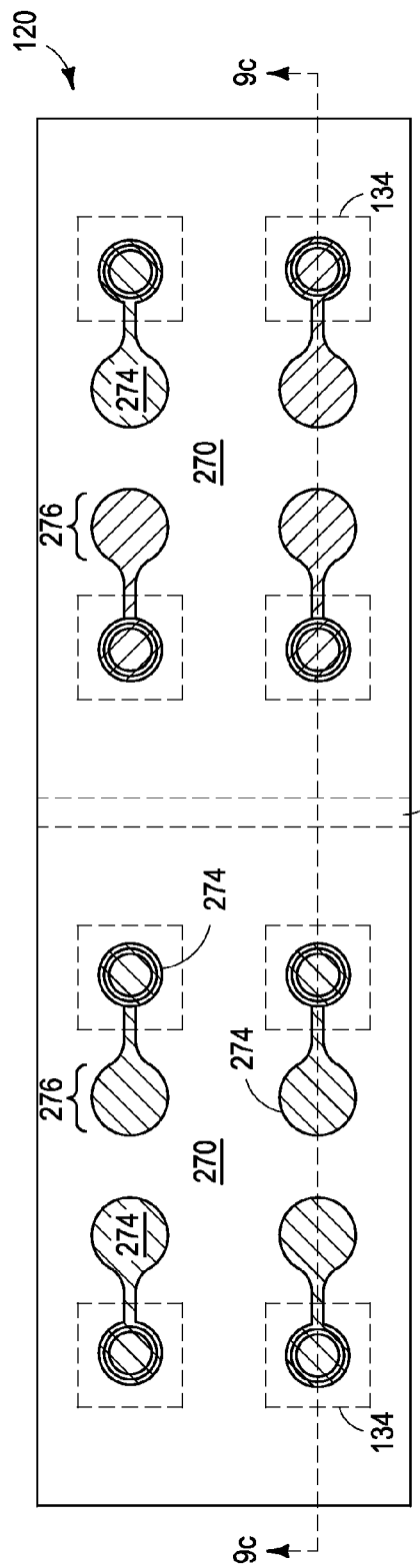
FIG. 9c
FIG. 9d

US 9,673,093 B2

SEMICONDUCTOR DEVICE AND METHOD OF MAKING WAFER LEVEL CHIP SCALE PACKAGE

CLAIM OF DOMESTIC PRIORITY

The present application claims the benefit of U.S. Provisional Application No. 61/862,938, filed Aug. 6, 2013, which application is incorporated herein by reference.

FIELD OF THE INVENTION

The present invention relates in general to semiconductor devices and, more particularly, to a semiconductor device and method of manufacturing a wafer level chip scale package (WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

As demand for smaller and higher performance semiconductor devices increases, various packaging types such as ball grid array (BGA), flip chip, and wafer level chip scale package (WLCSP) are being developed and refined. Recent demands for WLCSP designs include larger semiconductor die size, finer interconnect pitch, higher performance, and lower cost. Solder joint reliability becomes a challenge for finer pitch and higher input/output (I/O) density devices while also reducing the cost of manufacturing WLCSP.

Another goal of semiconductor manufacturing is to produce more reliable semiconductor devices. In a conventional WLCSP structure, a passivation layer is formed over contact pads on a semiconductor wafer. An extremely-low dielectric constant (ELK) insulating layer may be formed beneath the contact pads. Redistribution layers (RDL), passivation layers, and polymer layers are formed over the semiconductor wafer. An under-bump metallization (UBM) layer is formed over the RDL and passivation layers prior to forming a solder bump. Intermetallic compound (IMC) layer forms between the solder bump and UBM. A semiconductor die is mounted to a substrate by the solder bumps. IMC also forms between the solder bumps and contact pads on the substrate. Brittle materials, such as IMC and ELK layers, are particularly susceptible to cracking under stress during WLCSP manufacturing.

Electronic packaging material properties and geometrical dimensions impact the mechanical behavior of semiconductor packages. In many cases, excessive levels of stress imposed upon a conductive joint structure during the manufacturing process may cause failure phenomena such as UBM layer delamination, polymer layer delamination, IMC cracking, ELK cracking, solder bump cracking, and semiconductor die cracking which in turn reduces reliability and manufacturing yield. For example, delamination between the UBM layer and RDL is a common failure mode for a conventional WLCSP solder joint. Solder bump cracking is another common failure mode. The solder bump cracks near a corner of the RDL layer and propagates along the die-side IMC layer to cause joint failure. The solder bump also cracks near the contact pad on the substrate and propagates along the substrate-side IMC layer to cause joint failure. The use of a UBM layer reduces stress in the solder joint, however, the process of forming a UBM layer increases the cost of the WLCSP.

SUMMARY OF THE INVENTION

A need exists for a cost effective process of forming a WLCSP with reduced interfacial stress at the conductive joints to achieve reliability enhancement in low cost WLCSP. Accordingly, in one embodiment, the present invention is a method of making a semiconductor device comprising the steps of providing a semiconductor wafer, forming a conductive layer including an interconnect site over the semiconductor wafer, forming a first insulating layer over the conductive layer, forming an opening in the first insulating layer over the interconnect site, and forming an interconnect structure within the opening over the interconnect site.

In another embodiment, the present invention is a method of making a semiconductor device comprising the steps of providing a semiconductor die, forming a first conductive layer including an interconnect site over the semiconductor die, forming a first insulating layer including an opening over the interconnect site, and forming an interconnect structure over the interconnect site.

In another embodiment, the present invention is a semiconductor device comprising a semiconductor die. A conductive layer is formed over the semiconductor die. A first insulating layer including an opening is formed over the conductive layer. An interconnect structure is formed within the opening over the conductive layer.

In another embodiment, the present invention is a semiconductor device comprising a semiconductor die. A conductive layer is formed over the semiconductor die. A first insulating layer is formed over the conductive layer. An interconnect structure is formed over the conductive layer.

BRIEF DESCRIPTION OF THE DRAWINGS

FIGS. 2a-2f illustrate a semiconductor wafer with a plurality of semiconductor die separated by a saw street;

FIGS. 3a-3k illustrate a method of forming a WLCSP including a non-solder mask defined interconnect site;

FIGS. 4a-4f illustrate a WLCSP including a non-solder mask defined interconnect site;

FIGS. 9a-9i illustrate a method of forming a WLCSP including a non-solder mask defined interconnect site;

DETAILED DESCRIPTION OF THE DRAWINGS

Figure 1:
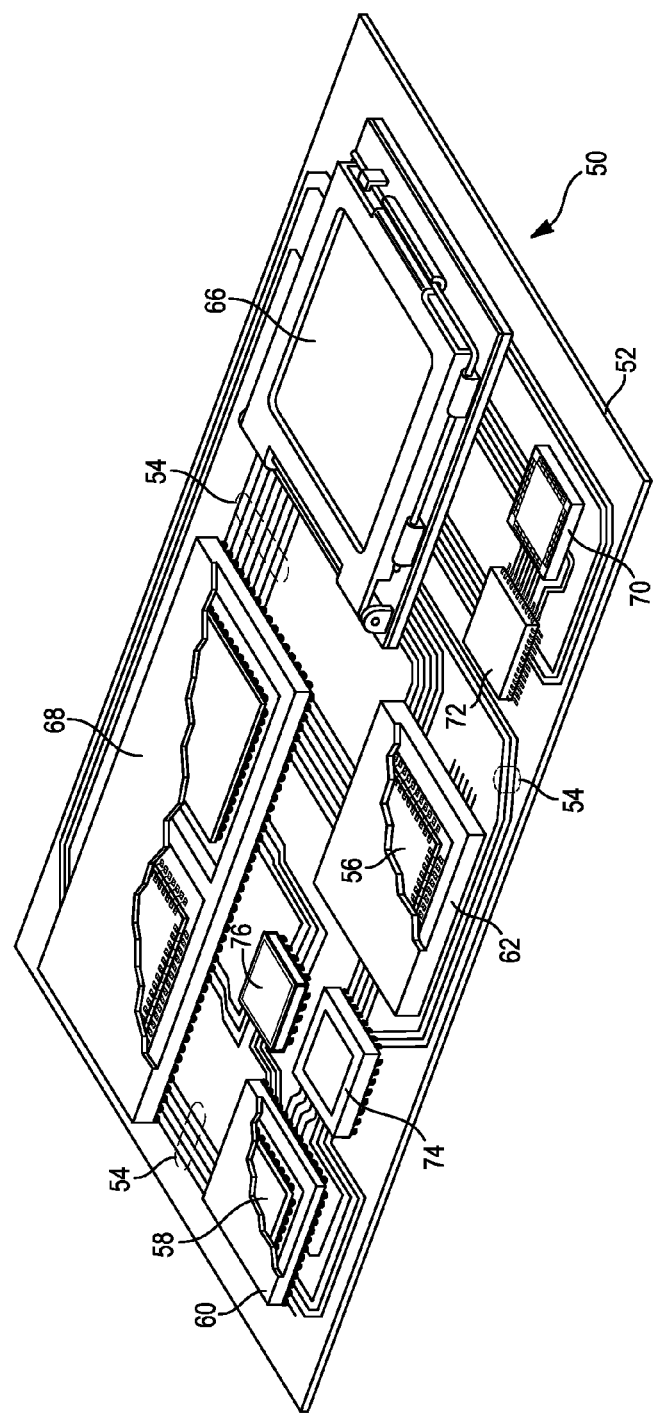
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and WLCSP 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
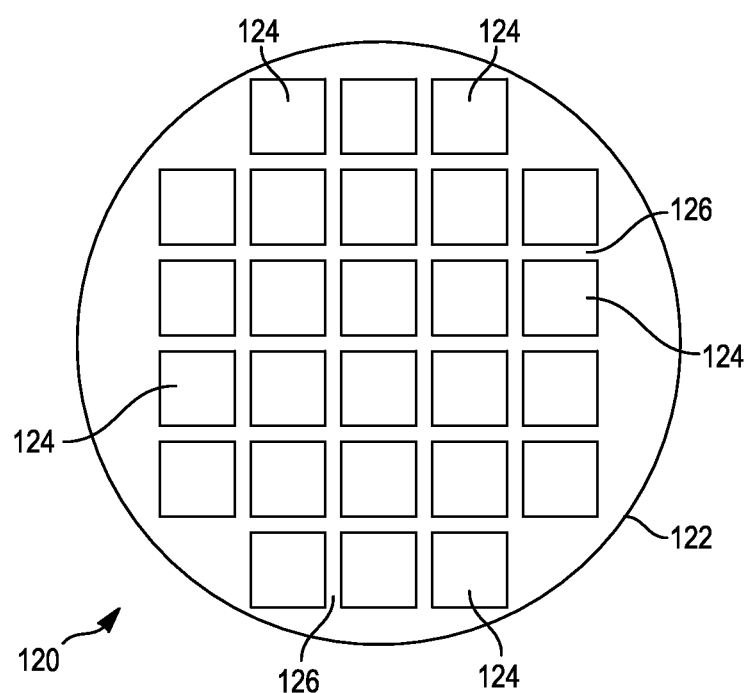

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. In one embodiment, the material selected for semiconductor wafer 120 includes a tensile modulus or Young's modulus of 131 gigapasals (GPa), a Poisson's ratio of 0.28, and a coefficient of thermal expansion (CTE) of 2.8 parts per million per degree Celsius (ppm/° C.). A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm) and a thickness of 150-450 micrometers (μm).

Figure 2B:
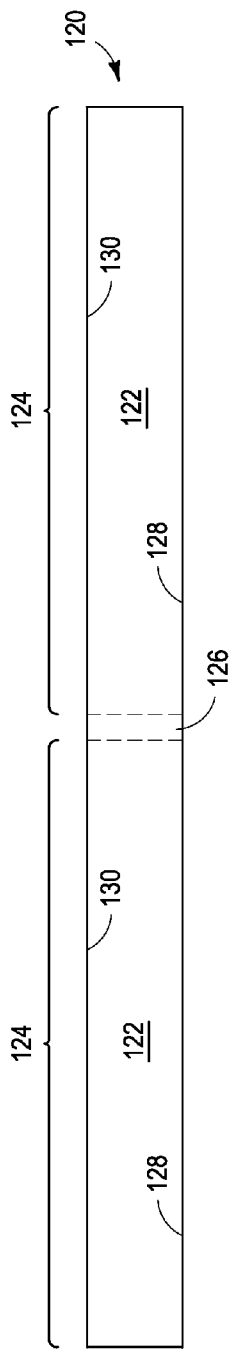

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, active region 130 contains a MEMS, such as an accelerometer, strain gauge, microphone, or other sensor responsive to various external stimuli. Semiconductor die 124 may also contain integrated passive devices (IPDs), such as inductors, capacitors, and resistors, for RF signal processing. In one embodiment, each semiconductor die 124 includes a length and width each ranging from approximately 2-10 mm. In another embodiment, semiconductor die 124 includes a length of 5.8 mm and a width of 5.3 mm.

Figure 2C:
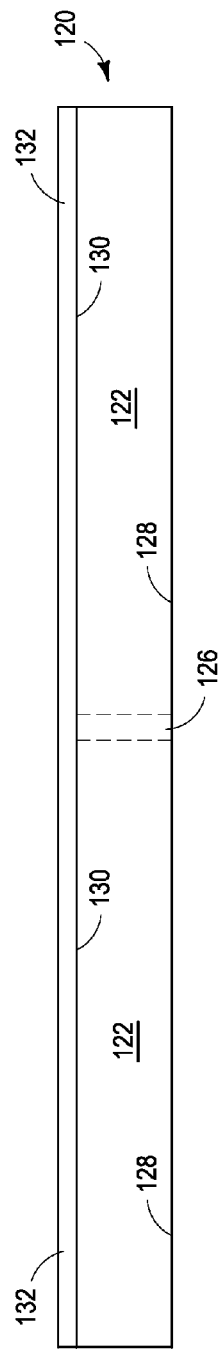

In FIG. 2c, an insulating or dielectric layer 132 is formed over active surface 130 of semiconductor wafer 120 using PVD, CVD, printing, spin coating, spray coating, sintering or thermal oxidation. Insulating layer 132 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), or other suitable insulating material. In some embodiments, insulating layer 132 includes an ELK insulating layer. In one embodiment, insulating layer 132 includes a thickness of approximately 5 μm or less. In another embodiment, insulating layer 132 is formed with a thickness in the range of approximately 3-7 μm. In one embodiment, the material selected for insulating layer 132 includes a Young's modulus of 10 GPa, a Poisson's ratio of 0.16, and a CTE of 5 ppm/° C. In another embodiment, the material selected for insulating layer 132 includes a Young's modulus ranging from approximately 5-20 GPa and a CTE ranging from approximately 5-25 ppm/° C.

Figure 2D:
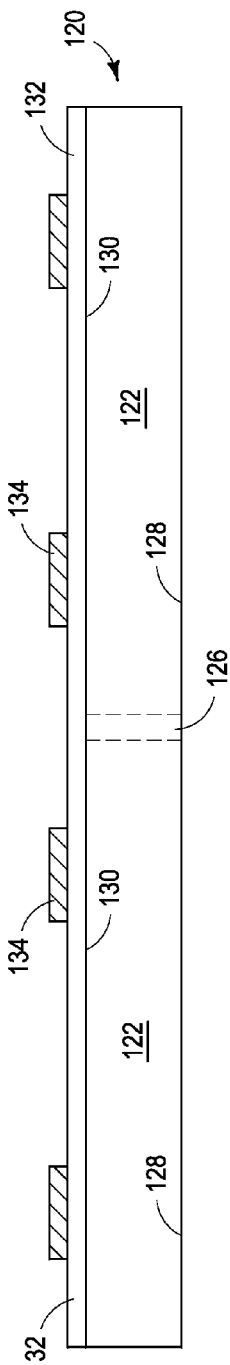

In FIG. 2d, an electrically conductive layer 134 is formed over insulating layer 132 and active surface 130 of semiconductor wafer 120 using PVD, CVD, electrolytic plating, electroless plating process, or other suitable metal deposition process. Conductive layer 134 can be one or more layers of aluminum (Al), copper (Cu), tin (Sn), nickel (Ni), gold (Au), silver (Ag), or other suitable electrically conductive material. Conductive layer 134 operates as contact pads electrically connected to the circuits on active surface 130.

In one embodiment, conductive layer 134 includes Al. In another embodiment, conductive layer 134 includes Cu. In yet another embodiment, the material selected for conductive layer 134 includes a Young's modulus of 110 GPa, a Poisson's ratio of 0.34, and a CTE of 17 ppm/° C.

FIG. 2e shows a plan view of semiconductor wafer 120 from FIG. 2d. Conductive layer 134 can be formed as contact pads disposed side-by-side a first distance from the edge of semiconductor die 124, as shown in FIG. 2e. Alternatively, conductive layer 134 can be formed as contact pads that are offset in multiple rows such that a first row of contact pads is disposed a first distance from the edge of the die, and a second row of contact pads alternating with the first row is disposed a second distance from the edge of the die.

In FIG. 2f, semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters, as shown in FIG. 2f, using a test probe head 140 including a plurality of probes or test leads 142, or other testing device. Probes 142 are used to make electrical contact with nodes or conductive layer 134 on each semiconductor die 124 and provide electrical stimuli to contact pads 134. Semiconductor die 124 responds to the electrical stimuli, which is measured by computer test system 144 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3A:
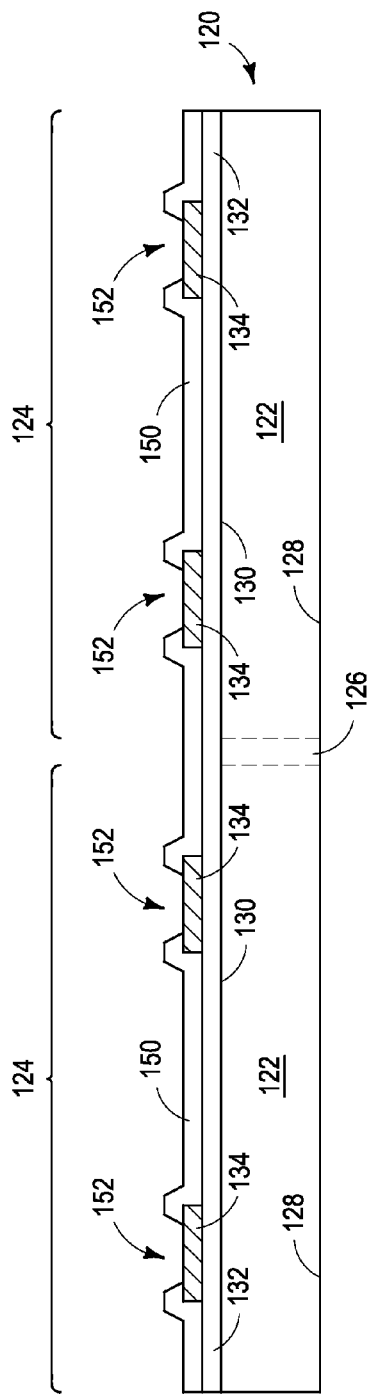

FIGS. 3a-3k, illustrate, in relation to FIGS. 1 and 2a-2f, a process of forming a WLCSP. FIG. 3a shows a cross-sectional view of a portion of semiconductor wafer 120. An insulating or passivation layer 150 is formed over active surface 130 of semiconductor wafer 120 using PVD, CVD, printing, spin coating, spray coating, sintering or thermal oxidation. Insulating layer 150 contains one or more layers of SiO2, Si3N4, SiON, Ta2O5, Al2O3, HfO2, BCB, PI, PBO, or other material having similar insulating and structural properties. In one embodiment, insulating layer 150 includes Si3N4 and undoped silicate glass (USG). Insulating layer 150 is formed covering insulating layer 132 and conductive layer 134. A portion of insulating layer 150 is removed from over conductive layer 134 to form openings 152 and expose a portion of conductive layer 134. In one embodiment, openings 152 are formed by patterning through a photolithography process. Alternatively, openings 152 are formed by an etching process or laser direct ablation (LDA) to remove a portion of insulating layer 150 and expose conductive layer 134. A first portion of insulating layer 150 is removed from over a central portion of conductive layer 134 while leaving a second portion of insulating layer 150 covering conductive layer 134. In one embodiment, insulating layer 150 includes a thickness of approximately 0.5 μm or less. In another embodiment, insulating layer 150 is formed with a thickness in the range of approximately 0.5-1.5 μm. In one embodiment, the material selected for insulating layer 150 includes a Young's modulus of 137.5 GPa, a Poisson's ratio of 0.206, and a CTE of 1.907 ppm/° C.

Figure 3B:
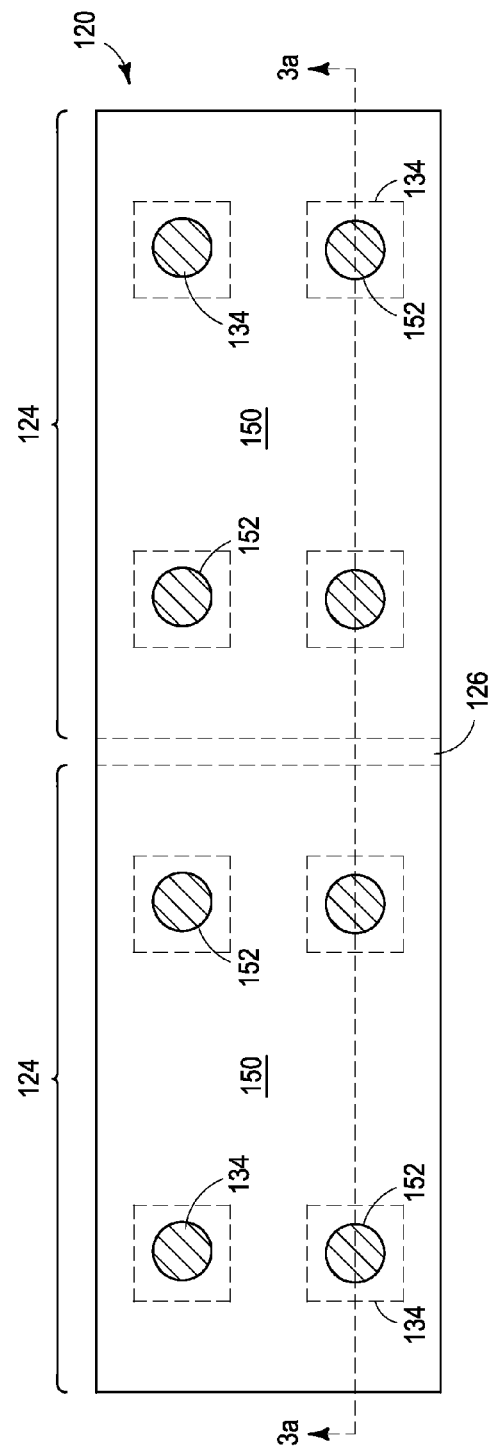

FIG. 3b shows a plan view of a portion of semiconductor wafer 120 from FIG. 3a. Insulating layer 150 overlies a portion of conductive layer 134, while openings 152 reveal a central portion of conductive layer 134 to expose the central portion of conductive layer 134 with respect to insulating layer 150.

In FIG. 3c, an insulating or dielectric layer 156 is formed over insulating layer 150 and conductive layer 134 and over active surface 130 of semiconductor wafer 120 using PVD, CVD, printing, spin coating, spray coating, sintering or thermal oxidation. Insulating layer 156 contains one or more layers of SiO2, Si3N4, SiON, Ta2O5, Al2O3, HfO2, BCB, PI, PBO, or other material having similar insulating and structural properties. In one embodiment, insulating layer 156 includes PBO. In another embodiment, the material selected for insulating layer 156 includes a Young's modulus of 2.3 GPa, a Poisson's ratio of 0.3, and a CTE of 64 ppm/° C. Insulating layer 156 is formed within openings 152 in insulating layer 150 and covers insulating layer 150 and a portion of conductive layer 134. In one embodiment, insulating layer 156 is formed with a thickness in the range of approximately 5-10 μm. In another embodiment, insulating layer 156 includes a thickness of approximately 7.5 μm or greater. In yet another embodiment, insulating layer 156 includes a thickness of approximately 10 μm or greater. A thickness of 10 μm or greater prevents damage to insulating layer 132 due to thermo-mechanical stress.

A portion of insulating layer 156 is removed from over conductive layer 134 to form openings 158 and expose a portion of conductive layer 134. In one embodiment, openings 158 are formed by patterning or by an etching process through a photo mask. Alternatively, openings 158 are formed by a photolithography process or LDA to remove a portion of insulating layer 156. A first portion of insulating layer 156 is removed from over a central portion of conductive layer 134 while leaving a second portion of insulating layer 156 covering conductive layer 134 and insulating layer 150.

FIG. 3d shows a plan view of semiconductor wafer 120 from FIG. 3c. Insulating layer 156 overlies a portion of conductive layer 134 and contacts an exposed surface of conductive layer 134, while openings 158 reveal a central portion of conductive layer 134 to expose the central portion of conductive layer 134 with respect to insulating layer 156. Openings 158 reveal a central portion of conductive layer 134 for subsequent electrical interconnection. Insulating layer 156 covers insulating layer 150. In one embodiment, openings 158 in insulating layer 156 include a diameter less than a diameter of openings 152 formed through insulating layer 150. Insulating layer 156 overlies the portion of insulating layer 150 which overlies conductive layer 134.

Figure 3E:
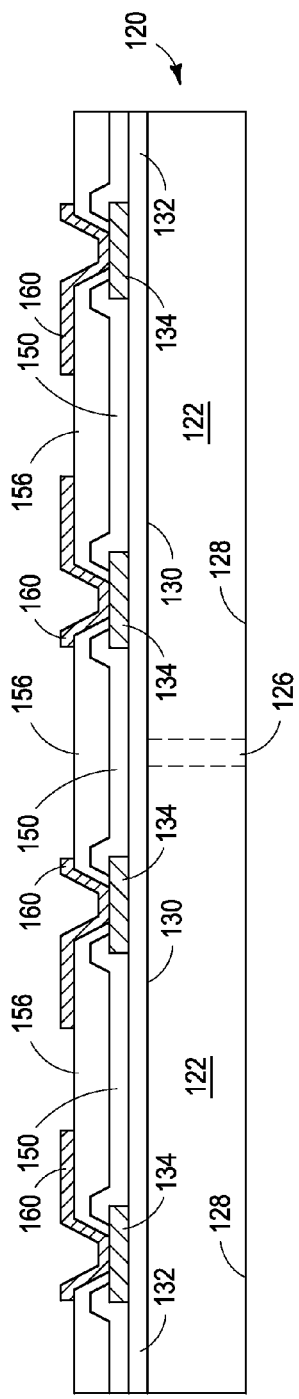

In FIG. 3e, an electrically conductive layer 160 is formed over insulating layer 156 and conductive layer 134 using PVD, CVD, electrolytic plating, electroless plating, or other suitable metal deposition process. Conductive layer 160 contains one or more layers of Al, Cu, Sn, Ni, Au, Ag, Ti, W, titanium tungsten (TiW), titanium copper (TiCu), titanium tungsten copper (TiWCu), tantalum nitrogen copper (TaNCu), or other suitable electrically conductive material. A portion of conductive layer 160 is electrically connected to conductive layer or contact pads 134. Conductive layer 160 is conformally applied to and follows the contours of insulating layer 156 and is formed within openings 158 in insulating layer 156. Portions of conductive layer 160 can be electrically common or electrically isolated depending on the design and function of semiconductor die 124. Conductive layer 160 operates as an RDL to redistribute electrical connection from the semiconductor die. Conductive layer 160 can be a multi-metal stack with an adhesion layer, a barrier layer, and a seed or wetting layer. In one embodiment, conductive layer 160 includes Cu. In another embodiment, the material selected for conductive layer 160 includes a Young's modulus of 110 GPa, a Poisson's ratio of 0.34, and a CTE of 17 ppm/° C. In one embodiment, conductive layer 160 is formed having a thickness ranging from approximately 4-8.6 µm.

Figure 3F:
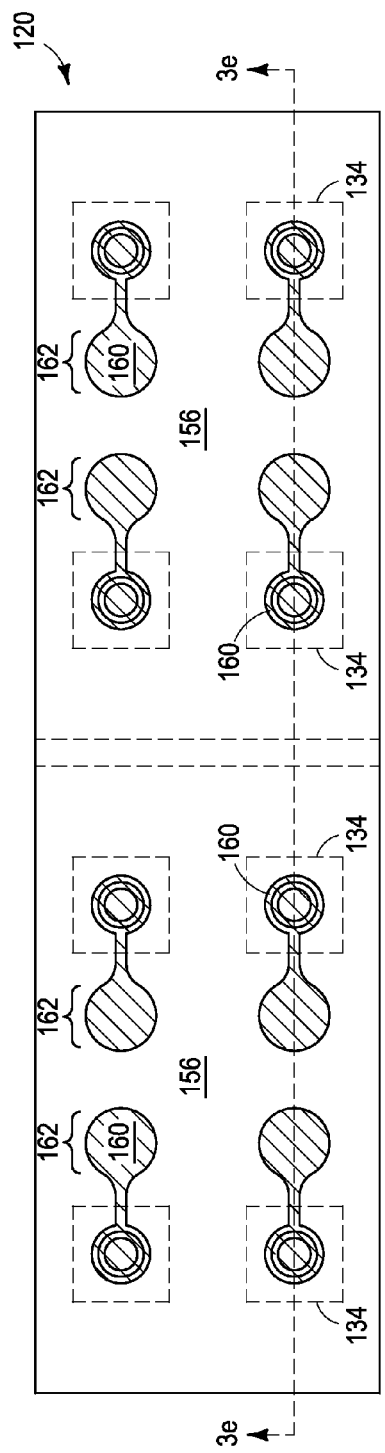

FIG. 3f a plan view of semiconductor wafer 120 from FIG. 3e. A portion of conductive layer 160 forms conductive pads or RDL pads 162. Conductive pads 162 operate as interconnect sites on conductive layer 160 for subsequently formed interconnect structures. In one embodiment, conductive pads 162 include a diameter ranging from approximately 180-280 µm. In another embodiment, conductive pads 162 include a diameter of approximately 240 µm. In yet another embodiment, conductive pads 162 include a diameter of approximately 257 µm.

Figure 3G:
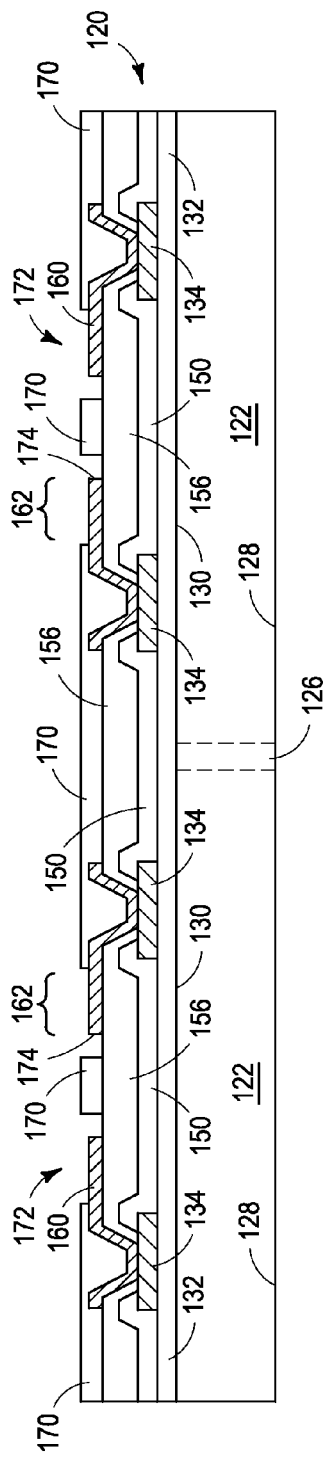

In FIG. 3g, an insulating or dielectric layer 170 is formed over insulating layer 156 and conductive layer 160 and over active surface 130 of semiconductor wafer 120 using PVD, CVD, printing, spin coating, spray coating, sintering or thermal oxidation. Insulating layer 170 contains one or more layers of SiO2, Si3N4, SiON, Ta2O5, Al2O3, HfO2, BCB, PI, PBO, or other material having similar insulating and structural properties. In one embodiment, insulating layer 170 includes a thickness of approximately 7.5 µm or greater. In another embodiment, insulating layer 170 is formed with a thickness in the range of approximately 10-15 µm. In one embodiment, the material selected for insulating layer 170 includes a Young's modulus of 2.3 GPa, a Poisson's ratio of 0.3, and a CTE of 64 ppm/° C.

A portion of insulating layer 170 is removed from over conductive layer 160 by forming openings 172 in insulating layer 170 to expose a portion of conductive layer 160. Insulating layer 170 covers a portion of conductive layer 160 while leaving exposed conductive pads 162. A portion of insulating layer 170 is removed from over conductive pads 162 and from an area adjacent to conductive pads. Openings 172 extend completely through insulating layer 170 to conductive layer 160 and insulating layer 156. Insulating layer 170 is removed from a peripheral region of conductive pads 162 such that a side surface 174 of conductive pads 162 is exposed with respect to insulating layer 170.

Figure 3H:
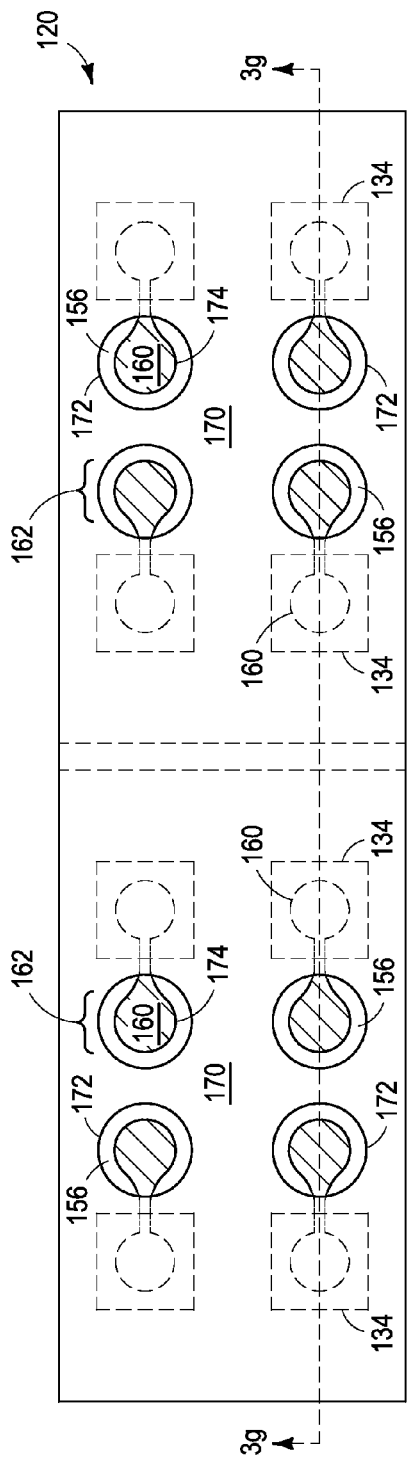

FIG. 3h shows a plan view of semiconductor wafer 120 from FIG. 3g. Openings 172 reveal conductive pads 162 and a portion of insulating layer 156 adjacent to conductive pads 162. In one embodiment, openings 172 are formed having a diameter greater than a diameter of conductive pads 162. In another embodiment, openings 172 include a diameter ranging from approximately 200-240 µm. In another embodiment, openings 172 include a diameter ranging from approximately 180-210 µm. In yet another embodiment, openings 172 include a diameter of up to approximately 270 µm. Where openings 172 are larger than conductive pads 162, the interconnect sites, which include conductive pads 162, constitute non-solder mask defined (NSMD) interconnects. Where openings 172 are equal to or smaller in diameter to conductive pads 162, the interconnect sites, which include conductive pad 162, constitute solder mask defined (SMD) interconnects.

Figure 3I:
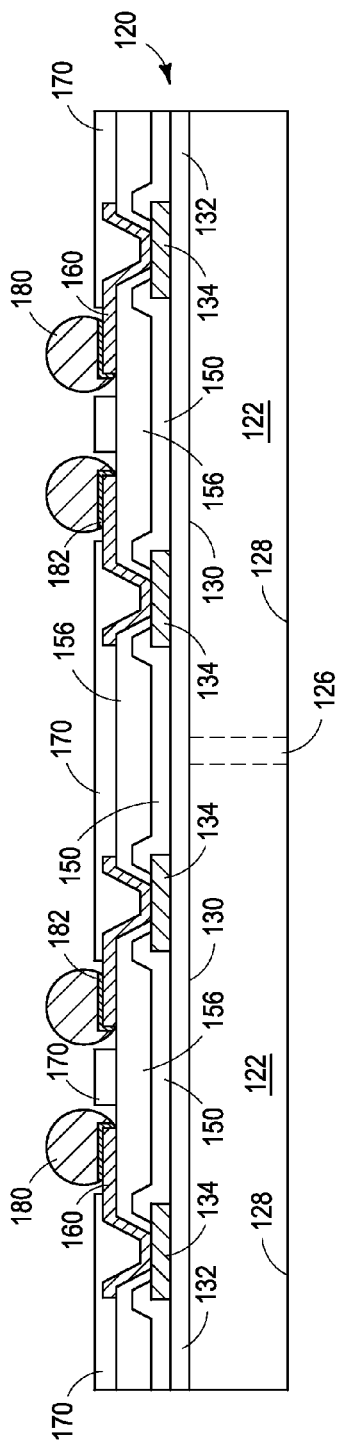

In FIG. 3i, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 180. In some applications, bumps 180 are reflowed a second time to improve electrical contact to conductive layer 160. Bumps 180 can also be compression bonded or thermocompression bonded to conductive layer 160. Bumps 180 represent one type of interconnect structure that can be formed over conductive layer 160. The interconnect structure can also use bond wires, conductive paste, stud bump, micro bump, or other electrical interconnect. In one embodiment, bumps 180 include a lead-free Sn/Ag/Cu alloy containing 95.5% Sn, 4% Ag, and 0.5% Cu (95.5Sn4Ag0.5Cu). In one embodiment, the material selected for bumps 180 includes a Poisson's ratio of 0.35 and a Young's modulus of 46.625 GPa at −65° C., 43.625 GPa at −25° C., 39.875 GPa at 25° C., 36.125 GPa at 75° C., and 32.375 GPa at 125° C. In another embodiment, the material selected for bumps 180 includes a CTE of 20.196 ppm/° C. at −65° C., 20.876 ppm/° C. at −25° C., 21.726 ppm/° C. at 25° C., 22.576 ppm/° C. at 75° C., and 23.426 ppm/° C. at 125° C.

Bumps 180 contact an upper surface and side surface 174 of conductive pads 162 and conductive layer 160. In an NSMD interconnect, bumps 180 may also contact insulating layer 156 in an area adjacent to conductive pads 162. During the process of bonding interconnect structures or bumps 180 to conductive layer 160, bumps 180 react with conductive layer 160 to form an IMC 182 at the interface of bump 180 and conductive layer 160. IMC 182 forms between bump 180 and conductive layer 160. Where bumps 180 include Sn and conductive layer 160 includes Cu, IMC 182 is formed as Cu6Sn5 or Cu3Sn including a Young's modulus of 136 GPa, a Poisson's ratio of 0.25, and a CTE of 18.2 ppm/° C. In one embodiment, IMC 182 has a thickness ranging from approximately 1-5 µm.

Figure 3J:
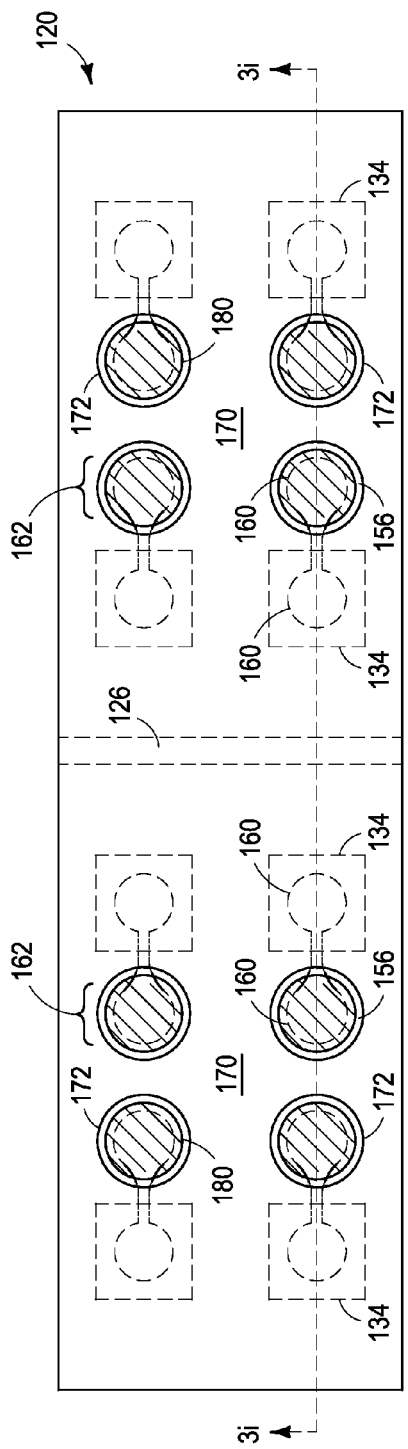

FIG. 3j shows a plan view of the portion of semiconductor wafer 120 from FIG. 3i. Bumps 180 are formed over conductive pads 162. In one embodiment, bumps 180 include a diameter greater than a diameter of conductive pads 162 and further include a diameter smaller than a diameter of openings 172 in insulating layer 170. Accordingly, the interconnect structure including bump 180 disposed over conductive pad 162 within opening 172 constitutes an NSMD interconnect. Bumps 180 contact an upper surface and side surface 174 of conductive layer 160 to improve the joint reliability between bumps 180 and conductive layer 160. In another embodiment, bumps 180 include a diameter ranging from approximately 220-280 µm. In one embodiment, bumps 180 are formed having a pitch ranging from approximately 300-400 µm. In another embodiment, bumps 180 include a diameter of approximately 250 µm and a pitch of approximately 400 µm. In one embodiment, bumps 180 include a height ranging from approximately 150-210 µm.

Figure 3K:
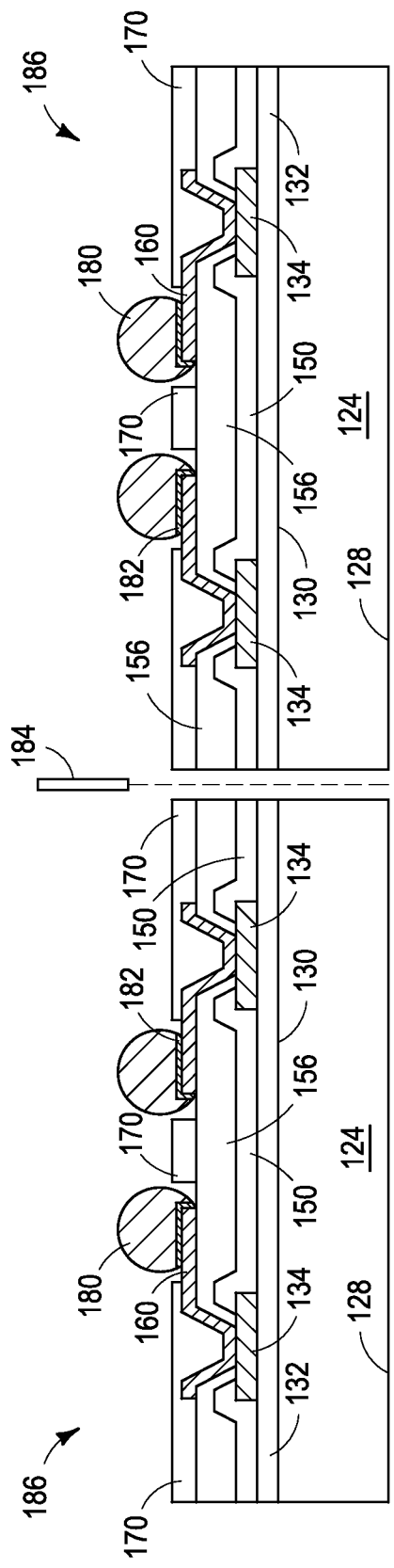

In FIG. 3k, semiconductor wafer 120 is singulated through saw street 126 using a saw blade or laser cutting tool 184 into individual WLCSP 186. The individual semiconductor die 124 of WLCSP 186 can be inspected and electrically tested for identification of KGD post singulation.

Figure 4C:
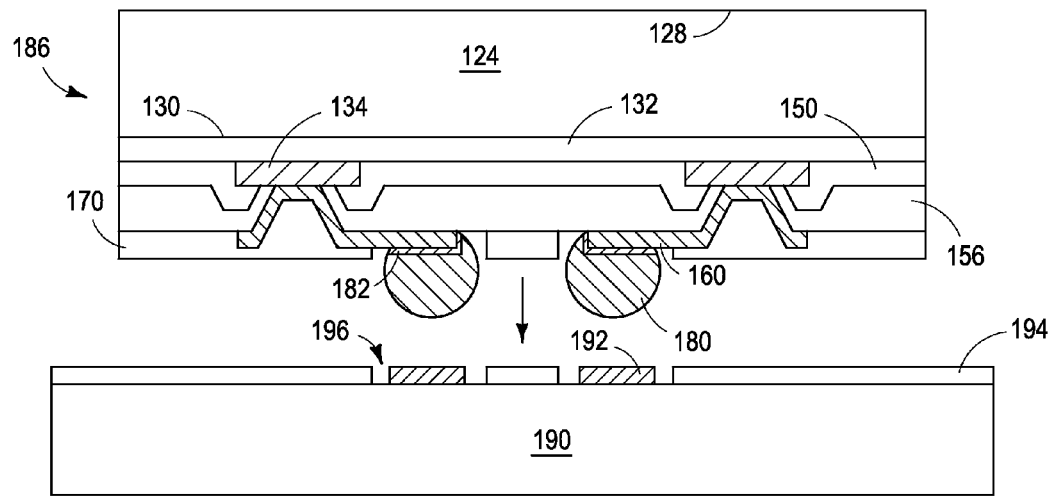

FIGS. 4a-4f illustrate, in relation to FIGS. 1, 2a-2f, and 3a-3k, a process of mounting a WLCSP to a substrate. Continuing from FIG. 3k, FIG. 4a shows semiconductor die 124 of WLCSP 186 after singulation. WLCSP 186 is formed with a low cost process by using fewer processing steps than a conventional WLCSP. The method of forming WLCSP 186 uses fewer steps than current WLCSP processes. In particular, the process of forming WLCSP 186 is accomplished with fewer masking steps. Additionally, the step of forming a UBM over the RDL pad and prior to forming the bump is eliminated. Therefore, WLCSP 186 can be produced more cost-effectively without the additional masking step and UBM formation. Elimination of masking and UBM steps reduces the cost of manufacturing WLCSP 186. WLCSP 186 has better performance and reliability than other low-cost WLCSP because the NSMD interconnect reduces stress on insulating layers 132 and 150, IMC 182, bump 180, and semiconductor die 124, thereby reducing damage to the joint structures due to thermo-mechanical stress.

FIG. 4b shows a portion of WLCSP 186 in greater detail. Conductive layer 160 is shown having one or more layers of conductive material. In one embodiment, conductive layer 160 includes a UBM layer with a wetting or adhesion layer 160a, a barrier layer 160b, and a seed layer 160c. Adhesion layer 160a is formed over conductive layer 134 and can be Ti, Al, TiW, titanium nitride (TiN), or chromium (Cr). Barrier layer 160b is formed over adhesion layer 160a and can be Ni, Ti, TiW, tantalum nitride (TaN), nickel vanadium (NiV), platinum (Pt), palladium (Pd), chromium copper (CrCu), or other suitable barrier material. Barrier layer 160b inhibits the diffusion of Cu into the active area of semiconductor die 124. Seed layer 160c is formed over barrier layer 160b and can be Cu, Ni, NiV, Au, or Al. Conductive layer 160 provides a low resistive interconnect to conductive layer 134, as well as a barrier to solder diffusion and a seed layer for solder wettability.

FIG. 4c shows a substrate or PCB 190 containing one or more laminated layers of polytetrafluoroethylene pre-impregnated (prepreg), FR-4, FR-1, CEM-1, CEM-3, or other material having similar insulating and structural properties. Substrate 190 may include an epoxy, resin, or polymer with a reinforcement fiber or fabric, such as phenolic cotton paper, epoxy, resin, woven glass, matte glass, polyester, and other reinforcement fibers or fabrics. Substrate 190 can also be a multi-layer flexible laminate, ceramic, copper foil, glass, or semiconductor wafer including an active surface containing one or more transistors, diodes, and other circuit elements to implement analog circuits or digital circuits. Substrate 190 may include a base substrate material such as silicon, germanium, aluminum phosphide, aluminum arsenide, gallium arsenide, gallium nitride, indium phosphide, silicon carbide, or other bulk semiconductor material for structural support. Substrate 190 may include insulating and conductive layers formed over or within substrate 190 depending on the functionality and specifications of substrate 190 and semiconductor die 124. In one embodiment, the material selected for substrate 190 includes FR-4 and includes a Young's modulus of 22 GPa, a Poisson's ratio of 0.28, and a CTE of 18.5 ppm/° C. In one embodiment, substrate 190 includes a length of 10 mm and a width of 10 mm. In another embodiment, substrate 190 includes a thickness ranging from approximately 800-1600 μm.

An electrically conductive layer 192 is formed over substrate 190 using PVD, CVD, electrolytic plating, electroless plating process, or other suitable metal deposition process. Conductive layer 192 can be one or more layers of Al, Cu, Sn, Ni, Au, Ag, or other suitable electrically conductive material. Conductive layer 192 operates as contact pads, pins, or traces electrically connected to substrate 190. Conductive layer 192 can be disposed as contact pads side-by-side a first distance from the edge of substrate 190. Alternatively, conductive layer 192 can be offset in multiple rows such that conductive layer 192 includes a first row of contact pads disposed a first distance from the edge of the substrate 190, and a second row of contact pads alternating with the first row and disposed a second distance from the edge of substrate 190. In one embodiment, conductive layer 192 includes a diameter of approximately 220 μm and a thickness of approximately 25 μm. In another embodiment, conductive layer 192 includes a diameter ranging from approximately 200-240 μm and a thickness ranging from approximately 15-35 μm.

An insulating or passivation layer 194 is formed over substrate 190 and conductive layer 192 using PVD, CVD, printing, spin coating, spray coating, sintering or thermal oxidation. Insulating layer 194 contains one or more layers of SiO2, Si3N4, SiON, Ta2O5, Al2O3, HfO2, BCB, PI, PBO, or other suitable insulating material. In one embodiment, insulating layer 194 includes a solder resist and includes a thickness of 30 μm. In another embodiment, insulating layer 194 includes a thickness ranging from approximately 20-40 μm. In one embodiment, the material selected for insulating layer 194 includes a Young's modulus of 3.2 GPa, a Poisson's ratio of 0.4, a CTE of 58 ppm/° C. below a glass transition temperature of 105° C., and a CTE of 153 ppm/° C. above a glass transition temperature of 105° C.

A portion of insulating layer 194 is removed from over conductive layer 192 to form openings 196 and expose a portion of conductive layer 192. In one embodiment, openings 196 are formed by patterning or by an etching process through a photo mask. Alternatively, openings 196 are formed by a photolithography process or LDA to remove a portion of insulating layer 194. In one embodiment, openings 196 are larger than conductive layer 192. Openings 196 extend completely through insulating layer 194 to expose a portion of substrate 190 adjacent to conductive layer 192. In another embodiment, openings 196 include a diameter of approximately 300 μm. In yet another embodiment, openings 196 include a diameter ranging from approximately 280-320 μm. Where openings 196 include a diameter greater than a diameter of conductive layer 192, the interconnect site constitutes an NSMD interconnect.

WLCSP 186 including semiconductor die 124 is mounted to substrate 190 using a pick and place operation with active surface 130 and bumps 180 oriented toward substrate 190.

Figure 4D:
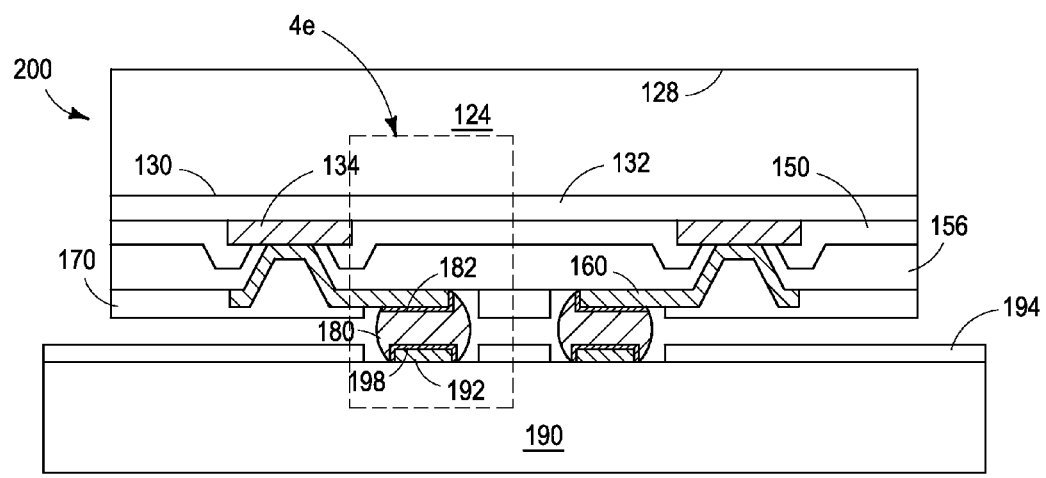

FIG. 4d shows semiconductor die 124 mounted to substrate 190. Semiconductor die 124 mounted to substrate 190 forms semiconductor package 200. Additional electrically conductive layers and insulating layers may be formed over substrate 190 prior to mounting semiconductor die 124. Bumps 180 are electrically connected to conductive layer 192. Bumps 180 are bonded to conductive layer 192 using a suitable attachment or bonding process. In one embodiment, bumps 180 are reflowed by heating the bump material above its melting point. In some applications, bumps 180 are reflowed a second time to improve electrical contact to conductive layer 192. Bumps 180 can also be compression bonded to conductive layer 192.

Bumps 180 contact an upper surface and side surface conductive layer 192. In an NSMD interconnect, bumps 180 may also contact substrate 190 in an area adjacent to conductive layer 192. During the process of bonding interconnect structures or bumps 180 to conductive layer 192, bumps 180 react with conductive layer 192 to form an IMC 198 at the interface of bump 180 and conductive layer 192. IMC 198 forms between bump 180 and conductive layer 192. Where bumps 180 include Sn and conductive layer 192 includes Cu, IMC 198 is formed as Cu6Sn5 or Cu3Sn and includes a Young's modulus of 136 GPa, a Poisson's ratio of 0.25, and a CTE of 18.2 ppm/° C. In one embodiment, IMC 198 has a thickness ranging from approximately 1-5 μm.

Figure 4E:
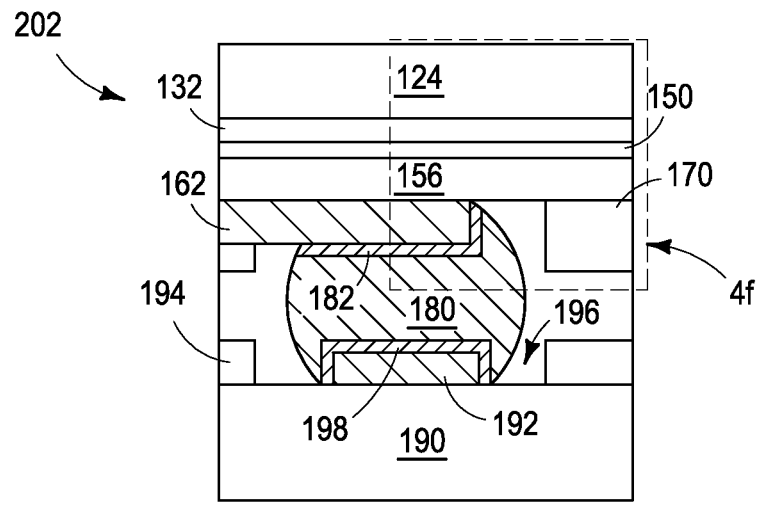

FIG. 4e shows a joint structure of semiconductor package 200 from FIG. 4d in greater detail. In FIG. 4e, joint structure 202 includes conductive pads 162, insulating layers 132, 150, 156, and 170, and bump 180 formed over semiconductor die 124. WLCSP 186 including semiconductor die 124 is mounted over substrate 190. Joint structure 202 further includes conductive layer 192 and insulating layer 194 formed over substrate 190. In one embodiment, substrate 190 includes a thickness of 1.6 mm, insulating layer 194 includes a thickness of 30 μm with an opening 196 diameter of 300 μm, and conductive layer 192 includes a thickness of 25 μm and a diameter of 220 μm. Bump 180 is disposed over and electrically connected to conductive pad 162 and conductive layer 192. Bumps 180 contact conductive pad 162 and IMC 182 forms between bumps 180 and conductive pad 162. Bumps 180 further contact conductive layer 192 and IMC 198 forms between bumps 180 and conductive layer 192. In one embodiment, bump 180 includes 95.5Sn4Ag0.5Cu lead-free solder and a diameter of 250 μm and is disposed between semiconductor die 124 and substrate 190 at a pitch of 400 μm.

Joint structure 202 comprises an NSMD interconnect on the side of bump 180 adjacent to semiconductor die 124, i.e., the die side. Joint structure 202 further comprises an NSMD interconnect on the side of bump 180 adjacent to substrate 190, i.e., the substrate-side. Joint structure 202 is configured to reduce the stress at the interface between bump 180 and semiconductor die 124, in particular, to reduce the stress on insulating layers 132 and 150, conductive pad 162, IMC 182, and bump 180. Joint structure 202 is further configured to reduce the stress at the interface between bump 180 and substrate 190, in particular, to reduce the stress on conductive layer 192, IMC 198, and bump 180.

Controlling the stress at insulating layer 132 improves the reliability of joint structure 202. Stress at insulating layer 132 is reduced by increasing the thickness of insulating layer 156. Where a thickness of insulating layer 156 is increased by 5 μm, stress at insulating layer 132 is reduced by 20-30%. In one embodiment, a thickness of insulating layer 156 is greater than 10 μm in order to avoid damage to insulating layer 132. A thickness of substrate 190, pitch of bumps 180, and thickness of semiconductor die 124 also affect the stress on insulating layer 132. Where a thickness of substrate 190 is decreased by 400 μm, stress at insulating layer 132 is reduced by 20%. Where a thickness of semiconductor die 124 is decreased from 300 μm to 150 μm, stress at insulating layer 132 is reduced by 20%. Where a pitch of bumps 180 is decreased from by 50 μm, stress at insulating layer 132 is reduced by 10%. Additionally, increasing the diameter of conductive pad 162 results in conductive pad 162 absorbing a greater amount of stress, which reduces the stress at insulating layer 132. Additional design factors that result in reduced stress at insulating layer 132 include increasing the diameter of conductive layer 192 and selecting a material for insulating layer 132 including a lower Young's modulus, i.e., less than 20 GPa.

Controlling the stress at conductive pad 162 improves the reliability of joint structure 202. Stress at conductive pad 162 is reduced by decreasing the size of conductive pad 162 compared to the size of opening 172 in insulating layer 170. Because joint structure 202 constitutes an NSMD structure on the die side, stress transfer from insulating layer 170 to conductive pad 162 is reduced, thereby reducing the overall stress at conductive pad 162. Where the diameter of conductive pad 162 is decreased from 240 μm to 200 μm, the stress in conductive pad 162 is reduced by 40%. Where the diameter of conductive pad 162 is decreased from 280 μm to 240 μm, or the die-side interconnect is changed from an SMD structure to an NSMD structure, the stress in conductive pad 162 is reduced by approximately 50%. Where the diameter of openings 172 in insulating layer 170 increases from 220 μm to 240 μm, stress at conductive pad 162 is reduced by 20%. Where a thickness of substrate 190 is decreased by 400 μm, such as from 1200 μm to 800 μm, stress at conductive pad 162 is reduced by 20%. Where a thickness of semiconductor die 124 is decreased from 300 μm to 150 μm, stress at conductive pad 162 is reduced by 20%. Additional design factors that result in reduced stress at conductive pad 162 include increasing a thickness of conductive pad 162 to increase stiffness of conductive pad 162, increasing a thickness of insulating layer 156, decreasing a height or pitch of bumps 180, or increasing the diameter of conductive layer 192.

Controlling the stress at IMC 182 improves the reliability of joint structure 202. Stress at IMC 182 is reduced by reducing a diameter of conductive pad 162. Reducing the diameter of conductive pad 162 to less than 240 μm or to less than a size of opening 172 in insulating layer 170, to form an NSMD interconnect, results in a significant reduction in stress at IMC 182. Reducing the stress at IMC 182 reduces the cracking of bump 180. Where a thickness of substrate 190 is decreased from 1600 μm to 800 μm, stress at IMC 182 is reduced by 20%. Where a thickness of semiconductor die 124 is decreased from 300 μm to 150 μm, stress at IMC 182 is reduced by 20%. Additional design factors that result in reduced stress at IMC 182 include increasing the thickness of insulating layers 156 and 170, increasing the size of opening 172 in insulating layer 170, decreasing the diameter and pitch of bumps 180, decreasing the thickness of IMC 182, and increasing the diameter of conductive layer 192. Reducing stress at IMC 182 results in improved reliability of bumps 180 by reducing cracking in bumps 180 at the die side.

Controlling the stress at IMC 198 improves the reliability of joint structure 202. Stress at IMC 198 is reduced by decreasing the thickness of substrate 190. Reducing stress at IMC 198 results in improved reliability of bumps 180 by reducing cracking in bumps 180 at the substrate side. Additional design factors that result in reduced stress at IMC 198 include decreasing the pitch of bumps 180, increasing the thickness of IMC 198, and increasing the diameter of bumps 180. In addition, the size of semiconductor die 124 influences the stress response of joint structure 202. For a semiconductor die 124 size of 5.3 mm by 5.8 mm and a substrate 190 size of 10 mm by 10 mm, stress occurs in insulating layer 132, conductive pad 162, IMC 182, and IMC 198. Stress in insulating layer 132, conductive pad 162, IMC 182, and IMC 198 is reduced by over 40% where semiconductor die 124 size is increased to 10 mm by 10 mm or decreased to 2 mm by 2 mm. Stress in insulating layer 132, conductive pad 162, IMC 182, and IMC 198 is reduced by approximately 10% where semiconductor die 124 size is increased to 8 mm by 8 mm or decreased to 4 mm by 4 mm as compared with a semiconductor die 124 size of 5.3 mm by 5.8 mm. Therefore, semiconductor package 200 including joint structure 202 results in a more reliable interconnect structure, because stress on joint structure 202 is reduced resulting in less damage to joint structure 202.

Figure 4F:
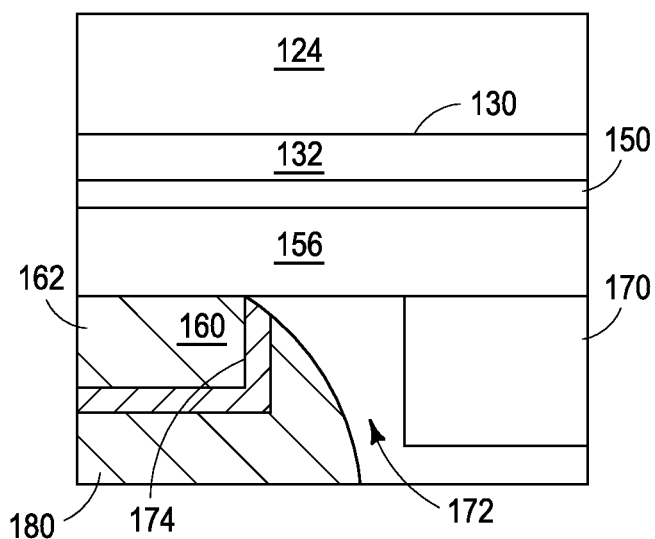

FIG. 4f shows a portion of joint structure 202 from semiconductor package 200 from FIG. 4e. Joint structure 202 comprises an NSMD interconnect. In one embodiment, semiconductor die 124 includes a thickness of 330 μm and dimensions of 5.3 mm by 5.8 mm. Insulating layer 132 includes a thickness of 5 μm, insulating layer 150 includes a thickness of 0.5 μm, conductive pad 162 includes a thickness of 8.0 μm and a diameter of 257 μm, insulating layer 156 includes a thickness of 7.5 μm, and insulating layer 170 includes a thickness 10 μm and with an opening 172 diameter of 240 μm.

Figure 5A:
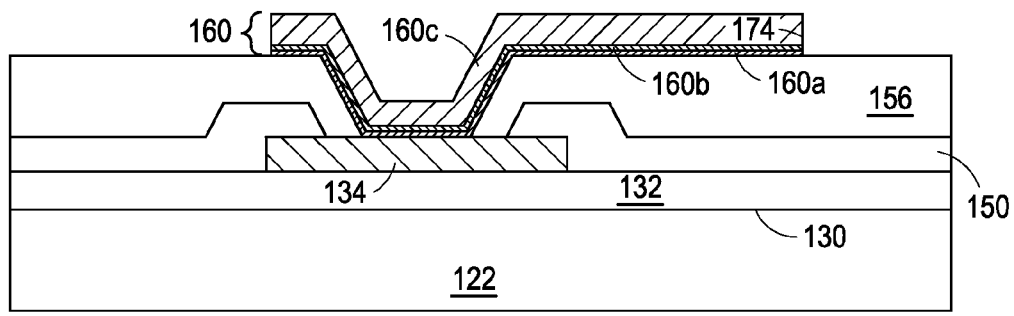
FIGS. 5a-5d illustrate another method of forming a WLCSP including a non-solder mask defined interconnect site.

FIGS. 5a-5d, illustrate, in relation to FIGS. 1 and 2a-2f, another process of forming a WLCSP. Continuing from FIG. 3e, FIG. 5a shows a portion of semiconductor wafer 120 including base substrate material 122. Insulating layer 132 is formed over active surface 130 of semiconductor wafer 120. Conductive layer 134 is formed over insulating layer 132. In one embodiment, conductive layer 134 operates as contact pads electrically connected to the circuits on active surface 130. Insulating layer 150 is formed over insulating layer 132 and over conductive layer 134. In one embodiment, insulating layer 150 operates as a passivation layer disposed over semiconductor wafer 120. An opening in insulating layer 150 exposes conductive layer 134 for subsequent electrical interconnection. Insulating layer 156 is formed over insulating layer 150 and over a portion of conductive layer 134 while leaving a central portion of conductive layer 134 exposed.

Conductive layer 160 is formed over insulating layer 156 and contacts the exposed portion of conductive layer 134. Portions of conductive layer 160 can be electrically common or electrically isolated depending on the design and function of the semiconductor die of semiconductor wafer 120. Conductive layer 160 operates as an RDL to redistribute electrical connection from the semiconductor die. Conductive layer 160 is shown having one or more layers of conductive material. In one embodiment, conductive layer 160 includes a UBM layer with a wetting or adhesion layer 160a, a barrier layer 160b, and a seed layer 160c. Adhesion layer 160a is formed over conductive layer 134 and can be Ti, Al, TiW, TiN, or Cr. Barrier layer 160b is formed over adhesion layer 160a and can be Ni, Ti, TiW, TaN, NiV, Pt, Pd, CrCu, or other suitable barrier material. Barrier layer 160b inhibits the diffusion of Cu into the active area of semiconductor die 124. Seed layer 160c is formed over barrier layer 160b and can be Cu, Ni, NiV, Au, or Al. Conductive layer 160 provides a low resistive interconnect to conductive layer 134, as well as a barrier to solder diffusion and a seed layer for solder wettability.

Figure 5B:
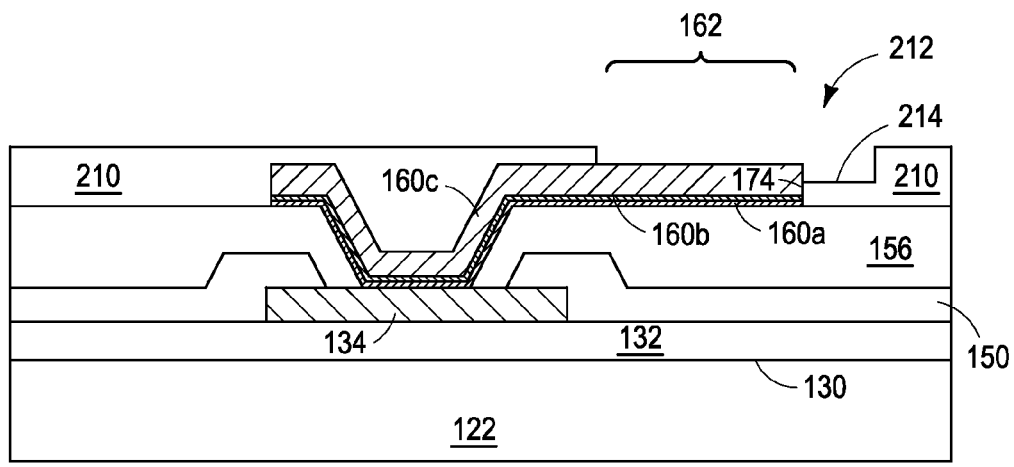

In FIG. 5b, an insulating or passivation layer 210 is formed over insulating layer 156 and conductive layer 160 and over active surface 130 of semiconductor wafer 120 using PVD, CVD, printing, spin coating, spray coating, sintering or thermal oxidation. Insulating layer 210 contains one or more layers of SiO2, Si3N4, SiON, Ta2O5, Al2O3, HfO2, BCB, PI, PBO, or other material having similar insulating and structural properties. Insulating layer 210 covers insulating layer 156 and a portion of conductive layer 160. In one embodiment, insulating layer 210 includes a thickness of approximately 7.5 μm or greater. In another embodiment, insulating layer 210 is formed with a thickness in the range of approximately 10-15 μm. In one embodiment, the material selected for insulating layer 210 includes a Young's modulus of 2.3 GPa, a Poisson's ratio of 0.3, and a CTE of 64 ppm/° C.

A portion of insulating layer 210 is removed from over conductive layer 160 to form openings 212 and expose a portion of conductive layer 160. Insulating layer 210 covers a portion of conductive layer 160 while leaving exposed conductive pads 162. Openings 212 extend completely through insulating layer 210 in an area directly over conductive pads 162. Openings 212 extend partially through insulating layer 210 to surface 214 of insulating layer 210 in an area adjacent to conductive pads 162. A portion of insulating layer 210 remains disposed over and partially covering side surface 174 of conductive layer 160 and conductive pads 162. Openings 212 reveal an upper surface of conductive pads 162 and a portion of side surface 174 of conductive pads 162. A portion of side surface 174 of conductive layer 160 is exposed with respect to insulating layer 210. Insulating layer 210 includes a first thickness over insulating layer 156 that is greater than a second thickness of insulating layer 210 directly adjacent to conductive pad 162. Surface 214 of insulating layer 210 defines a second thickness of insulating layer 210, which contacts side surface 174 of conductive pads 162. Openings 212 form a NSMD interconnect site.

Figure 5C:
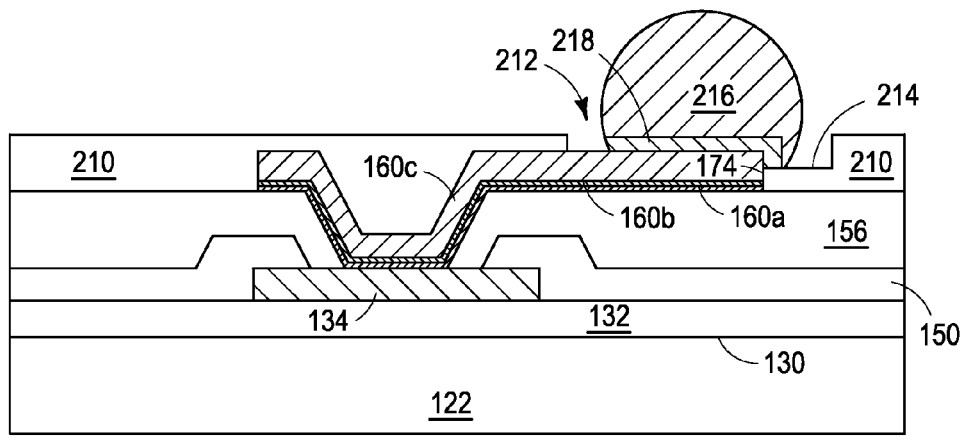

In FIG. 5c, an electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 216. In some applications, bumps 216 are reflowed a second time to improve electrical contact to conductive layer 160. Bumps 216 can also be compression bonded or thermocompression bonded to conductive layer 160. Bumps 216 represent one type of interconnect structure that can be formed over conductive layer 160. The interconnect structure can also use bond wires, conductive paste, stud bump, micro bump, or other electrical interconnect. In one embodiment, bumps 216 include 95.5Sn4Ag0.5Cu lead-free solder. In one embodiment, the material selected for bumps 216 includes a Poisson's ratio of 0.35 and a Young's modulus of 46.625 GPa at −65° C., 43.625 GPa at −25° C., 39.875 GPa at 25° C., 36.125 GPa at 75° C., and 32.375 GPa at 125° C. In another embodiment, the material selected for bumps 216 includes a CTE of 20.196 ppm/° C. at −65° C., 20.876 ppm/° C. at −25° C., 21.726 ppm/° C. at 25° C., 22.576 ppm/° C. at 75° C., and 23.426 ppm/° C. at 125° C.

Bumps 216 contact an upper surface and side surface 174 of conductive pads 162 and conductive layer 160. In an NSMD interconnect, bumps 216 may also contact insulating layer 210 at surface 214 in an area adjacent to conductive pads 162. During the process of bonding interconnect structures or bumps 216 to conductive layer 160, bumps 216 react with conductive layer 160 to form an IMC 218 at the interface of bump 216 and conductive layer 160. IMC 218 forms between bump 216 and conductive layer 160. Where bumps 216 include Sn and conductive layer 160 includes Cu, IMC 218 is formed as Cu6Sn5 or Cu3Sn including a Young's modulus of 136 GPa, a Poisson's ratio of 0.25, and a CTE of 18.2 ppm/° C. In one embodiment, IMC 218 has a thickness ranging from approximately 1-5 μm.

Figure 5D:
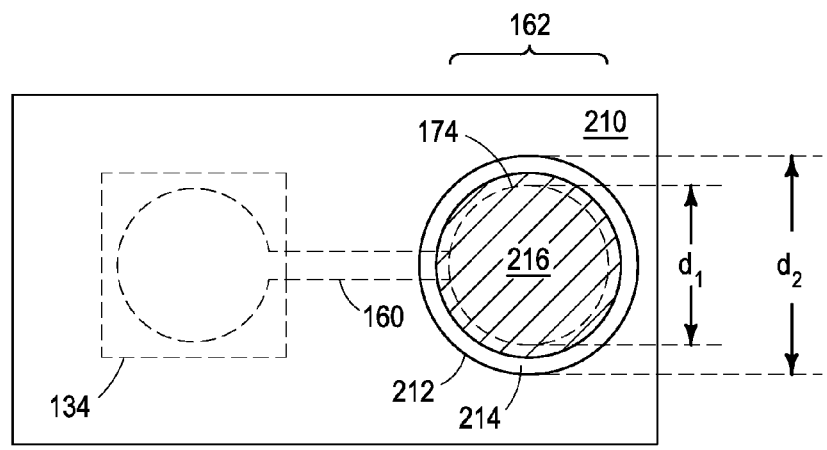

FIG. 5d shows a plan view of the portion of semiconductor wafer 120 from FIG. 5c. In FIG. 5d, bump 216 is formed over conductive pad 162 of conductive layer 160 and over insulating layer 210 within openings 212. Conductive pads 162 include a diameter $d_1$ which is less than a diameter $d_2$ of openings 212. In one embodiment, a diameter $d_1$ of conductive pads 162 ranges from approximately 200-240 μm. In another embodiment, a diameter $d_1$ of conductive pads 162 ranges from approximately 180-210 μm. In yet another embodiment, conductive pads 162 include a diameter $d_1$ of up to approximately 270 μm. Openings 212 extend completely through insulating layer 210 to conductive pads 162 in an area directly over conductive pads 162. Openings 212 extend partially through insulating layer 210 to surface 214 of insulating layer 210 in an area adjacent to conductive pad 162. In one embodiment, a diameter $d_2$ of openings 212 ranges from approximately 180-280 μm. Where diameter $d_2$ of openings 212 is greater than diameter $d_1$ of conductive pads 162, the interconnect sites, which include conductive pads 162, constitute NSMD interconnects. Where diameter $d_2$ of openings 212 is similar in diameter to conductive pads 162, but a thickness of insulating layer 210 directly adjacent to conductive pads 162 is less than a thickness of conductive pads 162 such that a side surface 174 of conductive pads 162 is partially exposed, an NSMD interconnect is formed.

Figure 6A:
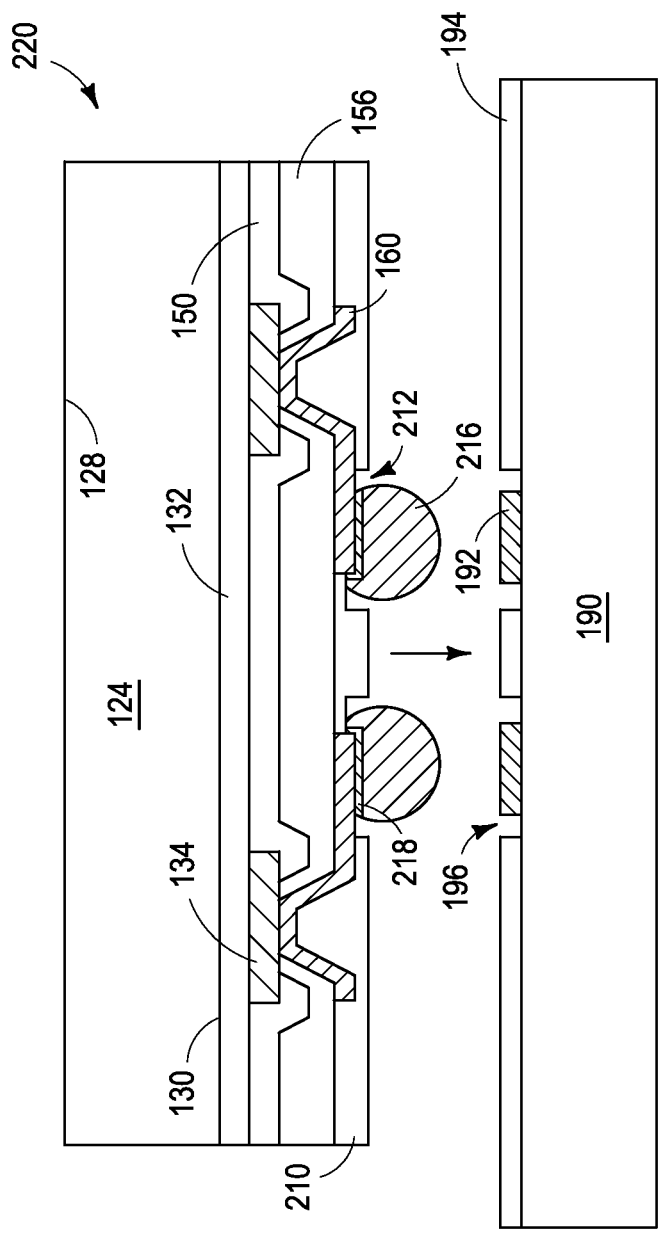
FIGS. 6a-6d illustrate a WLCSP including a non-solder mask defined interconnect site.

FIGS. 6a-6d illustrate, in relation to FIGS. 1, 2a-2f, and 5a-5d, a process of mounting a WLCSP to a substrate. Continuing from FIG. 5d, FIG. 6a shows semiconductor die 124 singulated from semiconductor wafer 120 to form individual WLCSPs 220. The individual semiconductor die 124 of WLCSP 220 can be inspected and electrically tested for identification of KGD post singulation.

FIG. 6a shows WLCSP 220 after singulation. WLCSP 220 is formed with a low cost process by using fewer processing steps than a conventional WLCSP. The method of forming WLCSP 220 uses fewer steps than current WLCSP processes. In particular, the process of forming WLCSP 220 is accomplished with fewer masking steps. Additionally, the step of forming a UBM over the RDL pad and prior to forming the bump is eliminated. Therefore, WLCSP 220 can be produced more cost-effectively without the additional masking step and UBM formation. Elimination of masking and UBM steps reduces the cost of manufacturing WLCSP 220. WLCSP 220 has better performance and reliability than other low-cost WLCSP because the NSMD interconnect reduces stress insulating layers 132 and 150, IMC 182, bump 180, and semiconductor die 124, thereby reducing damage to the joint structures due to thermo-mechanical stress.

FIG. 6a further shows a step of mounting semiconductor die 124 to substrate 190. A substrate or PCB 190 containing one or more laminated layers of prepreg, FR-4, FR-1, CEM-1, CEM-3, or other material having similar insulating and structural properties. Substrate 190 may include an epoxy, resin, or polymer with a reinforcement fiber or fabric, such as phenolic cotton paper, epoxy, resin, woven glass, matte glass, polyester, and other reinforcement fibers or fabrics. Substrate 190 can also be a multi-layer flexible laminate, ceramic, copper foil, glass, or semiconductor wafer including an active surface containing one or more transistors, diodes, and other circuit elements to implement analog circuits or digital circuits. Substrate 190 may include a base substrate material such as silicon, germanium, aluminum phosphide, aluminum arsenide, gallium arsenide, gallium nitride, indium phosphide, silicon carbide, or other bulk semiconductor material for structural support. Substrate 190 may include insulating and conductive layers formed over or within substrate 190 depending on the functionality and specifications of substrate 190 and semiconductor die 124. In one embodiment, the material selected for substrate 190 includes FR-4 and includes a Young's modulus of 22 GPa, a Poisson's ratio of 0.28, and a CTE of 18.5 ppm/° C. In one embodiment, substrate 190 includes a length of 10 mm and a width of 10 mm. In another embodiment, substrate 190 includes a thickness ranging from approximately 800-1600 μm.

An electrically conductive layer 192 is formed over substrate 190 using PVD, CVD, electrolytic plating, electroless plating process, or other suitable metal deposition process. Conductive layer 192 can be one or more layers of Al, Cu, Sn, Ni, Au, Ag, or other suitable electrically conductive material. Conductive layer 192 operates as contact pads, pins, or traces electrically connected to substrate 190. Conductive layer 192 can be disposed as contact pads side-by-side a first distance from the edge of substrate 190. Alternatively, conductive layer 192 can be offset in multiple rows such that conductive layer 192 includes a first row of contact pads disposed a first distance from the edge of the substrate 190, and a second row of contact pads alternating with the first row and disposed a second distance from the edge of substrate 190. In one embodiment, conductive layer 192 includes a diameter of approximately 220 μm and a thickness of approximately 25 μm. In another embodiment, conductive layer 192 includes a diameter ranging from approximately 200 μm to 240 μm. In another embodiment, conductive layer 192 includes a thickness ranging from approximately 15 μm to 35 μm.

An insulating or passivation layer 194 is formed over conductive layer 192 and substrate 190 using PVD, CVD, printing, spin coating, spray coating, sintering or thermal oxidation. Insulating layer 194 contains one or more layers of SiO2, Si3N4, SiON, Ta2O5, Al2O3, HfO2, BCB, PI, PBO, or other suitable insulating material. In one embodiment, insulating layer 194 includes a solder resist and includes a thickness of 30 μm. In another embodiment, insulating layer 194 includes a thickness ranging from approximately 20-40 μm. In one embodiment, the material selected for insulating layer 194 includes a Young's modulus of 3.2 GPa, a Poisson's ratio of 0.4, a CTE of 58 ppm/° C. below a glass transition temperature of 105° C., and a CTE of 153 ppm/° C. above a glass transition temperature of 105° C. A portion of insulating layer 194 is removed by an etching process or LDA to form openings 196 over conductive layer 192 and partially expose conductive layer 192. In one embodiment, openings 196 are larger than conductive layer 192. Openings 196 extend completely through insulating layer 194 to expose a portion of substrate 190 adjacent to conductive layer 192. In another embodiment, openings 196 include a diameter of approximately 300 μm. In yet another embodiment, openings 196 include a diameter ranging from approximately 280-320 μm. Where openings 196 include a diameter greater than a diameter of conductive layer 192, the interconnect site constitutes an NSMD interconnect.

Figure 6B:
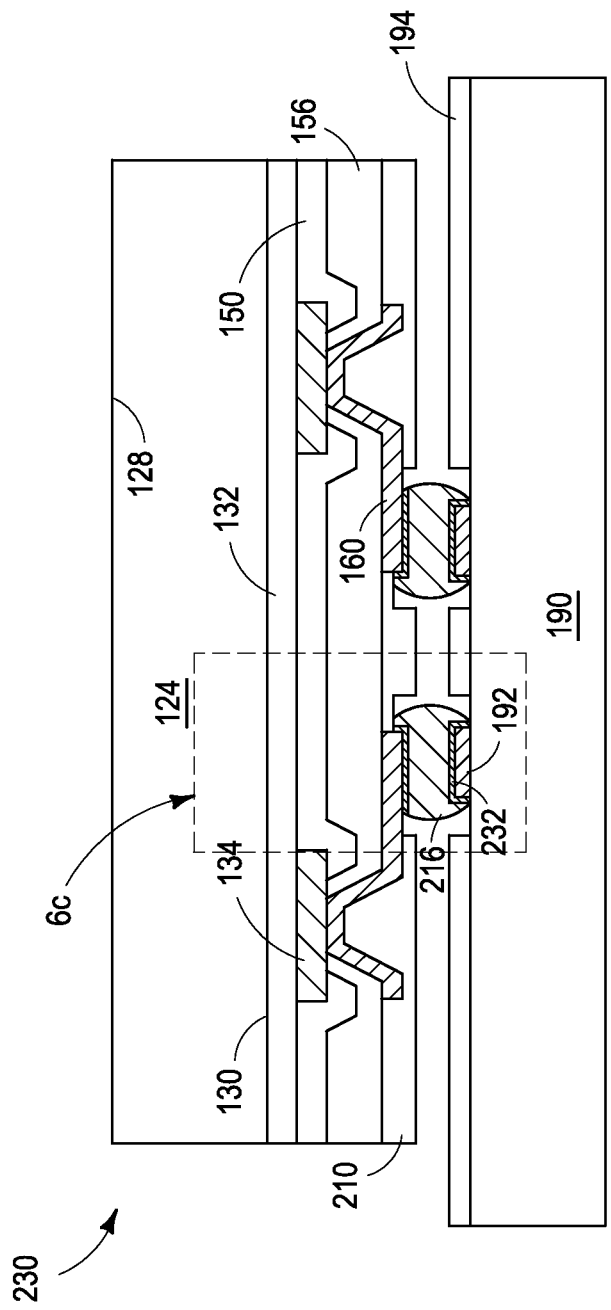

WLCSP 220 including semiconductor die 124 is mounted to substrate 190 using a pick and place operation with active surface 130 and bumps 216 oriented toward substrate 190. FIG. 6b shows semiconductor die 124 mounted to substrate 190. WLCSP 220 including semiconductor die 124 is mounted over substrate 190 to form semiconductor package 230. Additional electrically conductive layers and insulating layers may be formed over substrate 190 prior to mounting semiconductor die 124. Bumps 216 are electrically connected to conductive layer 192. Bumps 216 are bonded to conductive layer 192 using a suitable attachment or bonding process. In one embodiment, bumps 216 are reflowed by heating the bump material above its melting point. In some applications, bumps 216 are reflowed a second time to improve electrical contact to conductive layer 192. Bumps 216 can also be compression bonded to conductive layer 192.

Bumps 216 contact an upper surface and side surface conductive layer 192. In an NSMD interconnect, bumps 216 may also contact substrate 190 in an area adjacent to conductive layer 192. During the process of bonding interconnect structures or bumps 216 to conductive layer 192, bumps 216 react with conductive layer 192 to form an IMC 232 at the interface of bump 216 and conductive layer 192. IMC 232 forms between bump 216 and conductive layer 192. Where bumps 216 include Sn and conductive layer 192 includes Cu, IMC 232 is formed as Cu6Sn5 or Cu3Sn and includes a Young's modulus of 136 GPa, a Poisson's ratio of 0.25, and a CTE of 18.2 ppm/° C. In one embodiment, IMC 232 has a thickness ranging from approximately 1-5 μm.

Figure 6C:
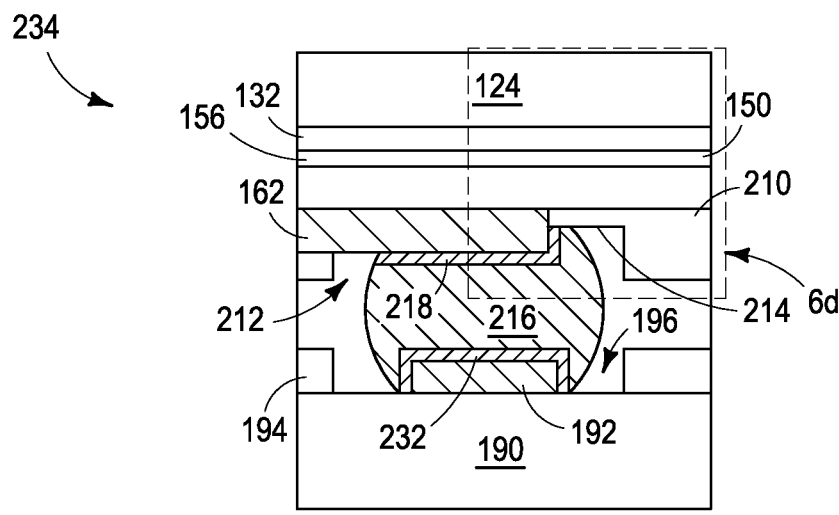

FIG. 6c shows a portion of semiconductor package 230 from FIG. 6b. In FIG. 6c, joint structure 234 includes conductive pads 162, insulating layers 132, 156, and 210, and bump 216 formed over semiconductor die 124. Joint structure 234 further includes conductive layer 192 and insulating layer 210 formed over substrate 190. In one embodiment, substrate 190 includes a thickness of 1.6 mm, insulating layer 194 includes a thickness of 30 μm with an opening 196 diameter of 300 μm, and conductive layer 192 includes a thickness of 25 μm and a diameter of 220 μm. Bump 216 is disposed over and electrically connected to conductive pad 162 and conductive layer 192. Bumps 216 contact conductive pad 162 and IMC 218 forms between bumps 216 and conductive pad 162. Bumps 216 further contact conductive layer 192 and IMC 232 forms between bumps 216 and conductive layer 192. In one embodiment, bump 216 includes 95.5Sn4Ag0.5Cu lead-free solder and includes a diameter of 250 μm and is disposed between semiconductor die 124 and substrate 190 at a pitch of 400 μm.

Joint structure 234 comprises an NSMD interconnect on the side of bump 216 adjacent to semiconductor die 124 and on the side of bump 216 adjacent to substrate 190. Joint structure 234 is configured to reduce the stress at the interface between bump 216 and semiconductor die 124, in particular, the stress on insulating layers 132 and 150, conductive pad 162, IMC 218, and bump 216. Joint structure 234 is further configured to reduce the stress at the interface between bump 216 and substrate 190, in particular, the stress on conductive layer 192, IMC 232, and bump 216.

Controlling the stress at insulating layer 132 improves the reliability of joint structure 234. Stress at insulating layer 132 is reduced by increasing the thickness of insulating layer 156. Where a thickness of insulating layer 156 is increased by 5 μm, stress at insulating layer 132 is reduced by 20-30%. In one embodiment, a thickness of insulating layer 156 is greater than 10 μm in order to avoid damage to insulating layer 132. A thickness of substrate 190, pitch of bumps 216, and thickness of semiconductor die 124 also affect the stress on insulating layer 132. Where a thickness of substrate 190 is decreased by 400 μm, stress at insulating layer 132 is reduced by 20%. Where a thickness of semiconductor die 124 is decreased from 300 μm to 150 μm, stress at insulating layer 132 is reduced by 20%. Where a pitch of bumps 216 is decreased from by 50 μm, stress at insulating layer 132 is reduced by 10%. Additionally, increasing the diameter of conductive pad 162 results in conductive pad 162 absorbing a greater amount of stress, which reduces the stress at insulating layer 132. Additional design factors that result in reduced stress at insulating layer 132 include increasing the diameter of conductive layer 192 and selecting a material for insulating layer 132 including a lower Young's modulus, i.e., less than 20 GPa.

Controlling the stress at conductive pad 162 improves the reliability of joint structure 234. Stress at conductive pad 162 is reduced by decreasing the size of conductive pad 162 compared to the size of opening 212 in insulating layer 210. Because joint structure 234 constitutes an NSMD structure on the die side, stress transfer from insulating layer 210 to conductive pad 162 is reduced, thereby reducing the overall stress at conductive pad 162. Where the diameter of conductive pad 162 is decreased from 240 μm to 200 μm, the stress in conductive pad 162 is reduced by 40%. Where the diameter of conductive pad 162 is decreased from 280 μm to 240 μm, or the die-side interconnect is changed from an SMD structure to an NSMD structure, the stress in conductive pad 162 is reduced by approximately 50%. Where the diameter of openings 212 in insulating layer 210 increases from 220 μm to 240 μm, stress at conductive pad 162 is reduced by 20%. Where a thickness of substrate 190 is decreased by 400 μm, such as from 1200 μm to 800 μm, stress at conductive pad 162 is reduced by 20%. Where a thickness of semiconductor die 124 is decreased from 300 μm to 150 μm, stress at conductive pad 162 is reduced by 20%. Additional design factors that result in reduced stress at conductive pad 162 include increasing a thickness of conductive pad 162 to increase stiffness of conductive pad 162, increasing a thickness of insulating layer 156, decreasing a height or pitch of bumps 216, or increasing the diameter of conductive layer 192.

Controlling the stress at IMC 218 improves the reliability of joint structure 234. Stress at IMC 218 is reduced by reducing a diameter of conductive pad 162. Reducing the diameter of conductive pad 162 to less than 240 μm or to less than a size of opening 212 in insulating layer 210, to form an NSMD interconnect, results in a significant reduction in stress at IMC 218. Reducing the stress at IMC 218 reduces the cracking of bump 216. Where a thickness of substrate 190 is decreased from 1600 μm to 800 μm, stress at IMC 218 is reduced by 20%. Where a thickness of semiconductor die 124 is decreased from 300 μm to 150 μm, stress at IMC 218 is reduced by 20%. Additional design factors that result in reduced stress at IMC 218 include increasing the thickness of insulating layers 156 and 210, increasing the size of opening 212 in insulating layer 210, decreasing the diameter and pitch of bumps 216, decreasing the thickness of IMC 218, and increasing the diameter of conductive layer 192. Reducing stress at IMC 218 results in improved reliability of bumps 216 by reducing cracking in bumps 216 at the die side.

Controlling the stress at IMC 232 improves the reliability of joint structure 234. Stress at IMC 232 is reduced by decreasing the thickness of substrate 190. Reducing stress at IMC 232 results in improved reliability of bumps 216 by reducing cracking in bumps 216 at the substrate side. Additional design factors that result in reduced stress at IMC 232 include decreasing the pitch of bumps 216, increasing the thickness of IMC 232, and increasing the diameter of bumps 216. In addition, the size of semiconductor die 124 influences the stress response of joint structure 234. For a semiconductor die 124 size of 5.3 mm by 5.8 mm and a substrate 190 size of 10 mm by 10 mm, stress occurs in insulating layer 132, conductive pad 162, IMC 218, and IMC 232. Stress in insulating layer 132, conductive pad 162, IMC 218, and IMC 232 is reduced by over 40% where semiconductor die 124 size is increased to 10 mm by 10 mm or decreased to 2 mm by 2 mm. Stress in insulating layer 132, conductive pad 162, IMC 218, and IMC 232 is reduced by approximately 10% where semiconductor die 124 size is increased to 8 mm by 8 mm or decreased to 4 mm by 4 mm as compared with a semiconductor die 124 size of 5.3 mm by 5.8 mm. Therefore, semiconductor package 230 including joint structure 234 results in a more reliable interconnect structure, because stress on joint structure 234 is reduced resulting in less damage to joint structure 234.

Figure 6D:
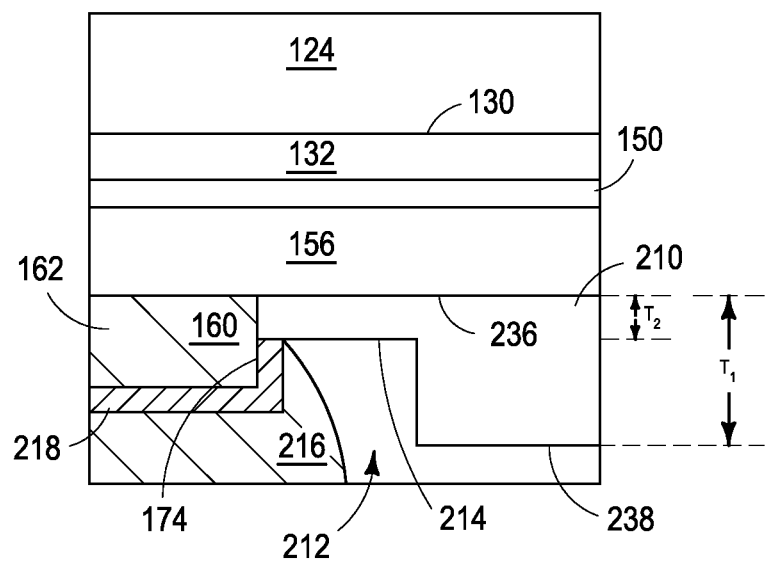

FIG. 6d shows a joint structure 234 of WLCSP 220 from semiconductor package 230 from FIG. 6c in greater detail. Joint structure 234 comprises an NSMD interconnect. In one embodiment, semiconductor die 124 includes a thickness of 330 μm and dimensions of 5.3 mm by 5.8 mm. Insulating layer 132 includes a thickness of 5 μm, insulating layer 150 includes a thickness of 0.5 μm, conductive pad 162 includes a thickness of 8.0 μm and a diameter of 257 μm, and insulating layer 156 includes a thickness of 7.5 μm. Insulating layer 210 includes a thickness $T_1$ of 10 μm over insulating layer 156, measured from surface 236 of insulating layer 156 to surface 238 of insulating layer 210. Opening 212 in insulating layer 210 includes a diameter of 240 μm. Insulating layer 210 further includes a thickness $T_2$ of less than 10 μm in an area directly adjacent to conductive pad 162. In one embodiment, thickness $T_2$ is less than thickness $T_1$ and is measured from surface 236 of insulating layer 156 to surface 214 of insulating layer 210. In another embodiment, thickness $T_2$ of insulating layer 210 adjacent to conductive pad 162 is less than a thickness of conductive pad 162. Bump 216 contacts conductive layer 160 at an upper surface and side surface 174 of conductive pad 162.

Figure 7:
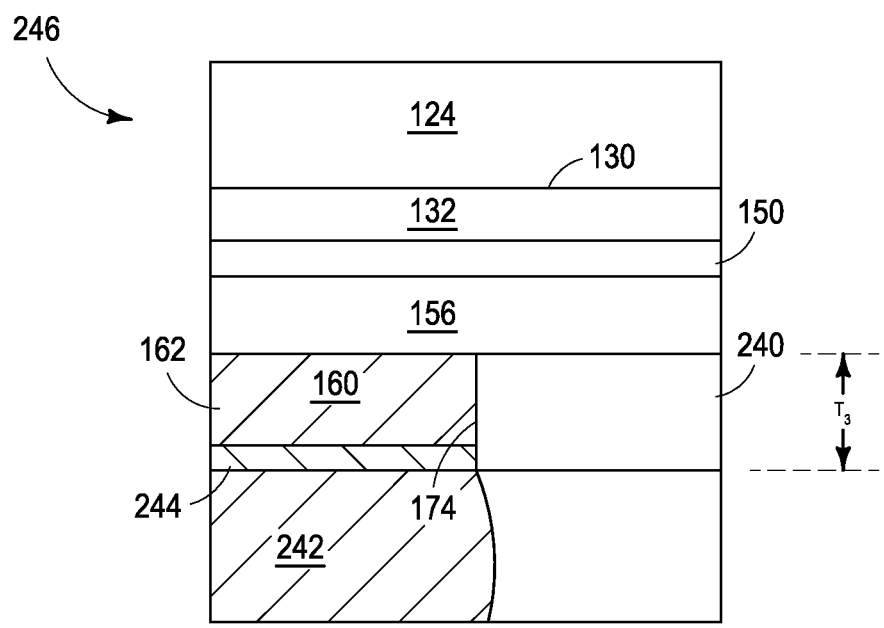
FIG. 7 illustrates a WLCSP including a solder mask defined interconnect site.

FIG. 7 shows an alternative joint structure for a WLCSP. Insulating layer 132 is formed over active surface 130 of semiconductor wafer 120. Conductive layer 134 is formed over insulating layer 132. In one embodiment, conductive layer 134 operates as contact pads electrically connected to the circuits on active surface 130. Insulating layer 150 is formed over insulating layer 132 and over conductive layer 134. In one embodiment, insulating layer 150 operates as a passivation layer disposed over semiconductor wafer 120. An opening in insulating layer 150 exposes conductive layer 134 for subsequent electrical interconnection. Insulating layer 156 is formed over insulating layer 150 and over a portion of conductive layer 134 while leaving a central portion of conductive layer 134 exposed.

An insulating or dielectric layer 240 is formed over insulating layer 156 and conductive layer 160 and over active surface 130 of semiconductor die 124 using PVD, CVD, printing, spin coating, spray coating, sintering or thermal oxidation. Insulating layer 240 contains one or more layers of SiO2, Si3N4, SiON, Ta2O5, Al2O3, HfO2, BCB, PI, PBO, or other material having similar insulating and structural properties. In one embodiment, the material selected for insulating layer 240 includes a Young's modulus of 2.3 GPa, a Poisson's ratio of 0.3, and a CTE of 64 ppm/° C. In one embodiment, insulating layer 240 includes a thickness $T_3$ greater than a thickness of conductive pad 162. In another embodiment, insulating layer 240 includes a thickness $T_3$ equal to or similar to a thickness of conductive pad 162. In another embodiment, insulating layer 240 includes a thickness $T_3$ of approximately 7.5 μm or greater.

In yet another embodiment, insulating layer 240 is formed with a thickness $T_3$ in the range of approximately 10-15 μm.

A portion of insulating layer 240 is removed from over conductive layer 160 to form openings and expose a portion of conductive layer 160. A portion of insulating layer 240 is removed from over conductive pads 162. Insulating layer 240 covers a portion of conductive layer 160 while leaving exposed conductive pads 162. In one embodiment, the openings in insulating layer 240 include a diameter similar to or equal to a diameter of conductive pads 162. In another embodiment, the openings in insulating layer 240 include a diameter of approximately 240 μm.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 242. In some applications, bumps 242 are reflowed a second time to improve electrical contact to conductive layer 160. Bumps 242 can also be compression bonded or thermocompression bonded to conductive layer 160. Bumps 242 represent one type of interconnect structure that can be formed over conductive layer 160. The interconnect structure can also use bond wires, conductive paste, stud bump, micro bump, or other electrical interconnect. In one embodiment, bumps 242 include 95.5Sn4Ag0.5Cu lead-free solder. In one embodiment, the material selected for bumps 242 includes a Poisson's ratio of 0.35 and a Young's modulus of 46.625 GPa at −65° C., 43.625 GPa at −25° C., 39.875 GPa at 25° C., 36.125 GPa at 75° C., and 32.375 GPa at 125° C. In another embodiment, the material selected for bumps 242 includes a CTE of 20.196 ppm/° C. at −65° C., 20.876 ppm/° C. at −25° C., 21.726 ppm/° C. at 25° C., 22.576 ppm/° C. at 75° C., and 23.426 ppm/° C. at 125° C.

During the process of bonding interconnect structures or bumps 242 to conductive layer 160, bumps 242 react with conductive layer 160 to form an IMC 244 at the interface of bump 242 and conductive layer 160. IMC 244 forms between bump 242 and conductive layer 160. Where bumps 242 include Sn and conductive layer 160 includes Cu, IMC 244 is formed as Cu6Sn5 or Cu3Sn including a Young's modulus of 136 GPa, a Poisson's ratio of 0.25, and a CTE of 18.2 ppm/° C. In one embodiment, IMC 244 has a thickness ranging from approximately 1-5 μm. Where bumps 242 contact an upper surface of conductive pads 162 and the openings in insulating layer 240 have a diameter similar to or equal to a diameter of conductive pads 162, joint structure 246 is formed having reduced stress at insulating layers 132 and 150 and at IMC 244 and bumps 242.

Figure 8:
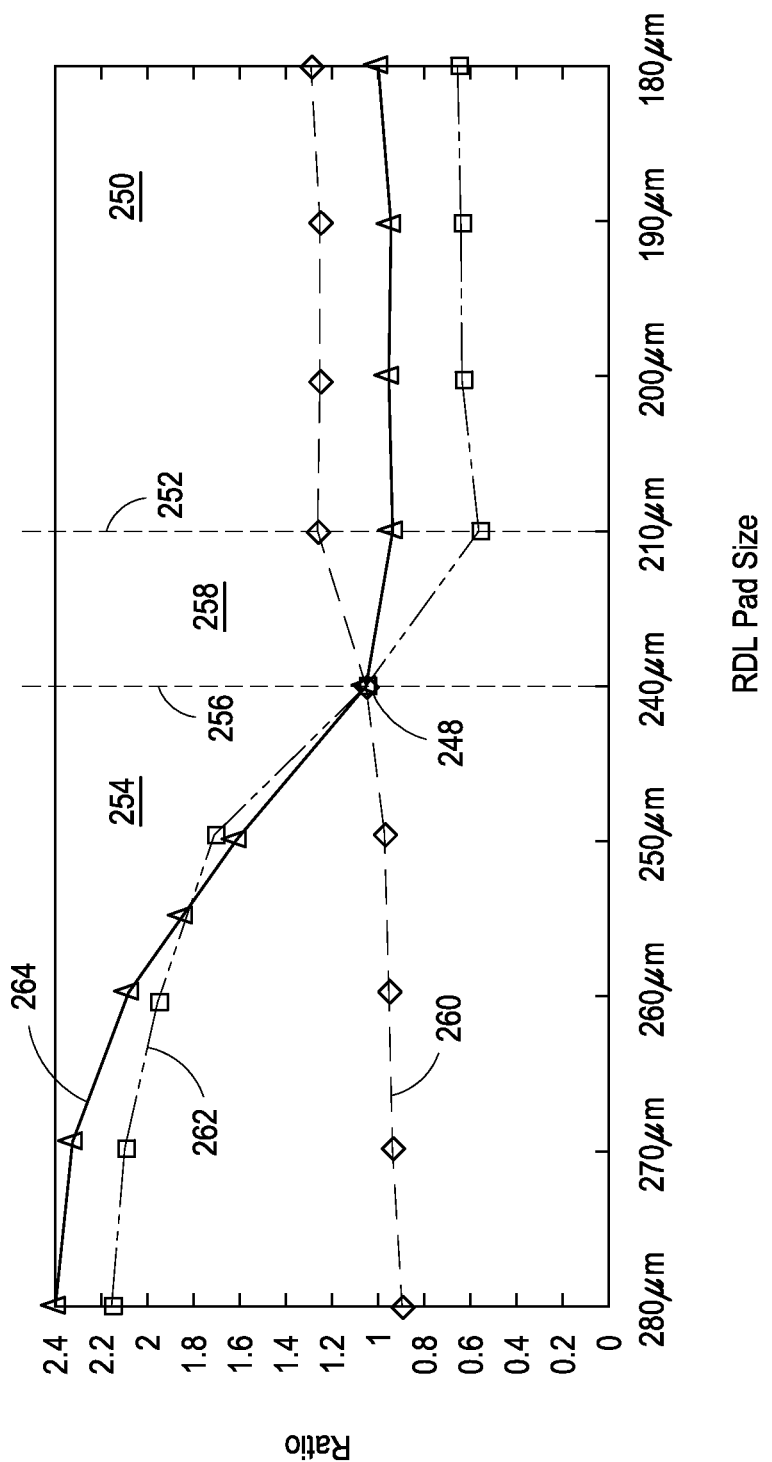
FIG. 8 illustrates a graphical representation of the stress on a WLCSP interconnect structure in relation to the RDL pad size.

FIG. 8 shows a graphical representation of the stress on a WLCSP interconnect structure in relation to the size of RDL pad. The stress response for joint structures having a 240 μm opening in the upper insulating layer, such as insulating layers 170, 210, or 240, is compared for various RDL pad sizes. To compare the stress response in SMD and NSMD joint structures, a stress response for a joint structure having a 240 μm RDL pad diameter and an insulating layer opening of 240 μm, such as joint structure 246 in FIG. 7, is normalized as a stress response ratio of 1 in the graph of FIG. 8. Therefore, joint structure 246 in FIG. 7 is illustrated as point 248 in FIG. 8, where conductive pad 162 and the opening in insulating layer 240 are similar or equal in diameter or size. Area 250 represents NSMD structures, such as joint structure 202 from FIG. 4e and joint structure 234 from FIG. 6c. Where the RDL pad, such as conductive pad 162, includes a diameter of less than 210 µm, the joint structure is NSMD and the stress response ratio is shown in area 250, which is defined by line 252. Where the RDL pad, such as conductive pad 162, includes a diameter of greater than 240 µm and the joint structure is SMD, the stress response ratio is shown in area 254, which is defined by line 256. Area 258 between lines 256 and 252 represents an interconnect or joint structure where the RDL pad is between 210-240 µm, which is close to or similar to the insulating layer opening diameter of 240 µm. The stress response measured at the ELK layer, such as insulating layer 132, is shown by line 260. Line 260 shows that as the size of the RDL pad decreases with respect to the size of the corresponding opening in the insulating layer, such as insulating layers 170, 210, or 240, the stress in the ELK layer increases slightly.

The stress response measured at the RDL pads, such as conductive pads 162, is shown by line 262. Line 262 shows that as the size of the RDL pad decreases with respect to the size of the corresponding opening in the insulating layer, such as in insulating layer 170, 210, or 240, the stress at the RDL pads decreases. The stress response measured at IMC on the die side, such as IMC 182 and 218, is shown by line 264. Line 264 shows that as the size of the RDL pad decreases with respect to the size of the corresponding opening in the insulating layer, the stress at the die-side IMC decreases. Therefore, for WLCSP having a plurality of insulating layers, such as insulating layer 156 and 170 or insulating layers 156 and 210, an NSMD interconnect reduces stress in the joint structure.

Where an NSMD interconnect structure is employed, rather than an SMD interconnect structure, the stress in the RDL pad and die-side IMC is reduced. For example, where RDL pad size increases from 240 µm to 250 µm, the stress in the RDL pad increases by 50%, shown by line 262. Similarly, where RDL pad size increases from 240 µm to 250 µm, the stress in the die-side IMC, such as IMC 182 and 218, increases by 50%, shown by line 264. Where RDL pad size increases from 240 µm to 270 µm, the stress in the RDL pad and in the die-side IMC, increases by almost double, as shown by lines 262 and 264. Further, increasing the RDL pad size causes an increase in ELK layer stress. Because an SMD interconnect results in a 15% decrease in ELK layer stress and a 50% increase in RDL pad and top IMC layer stress over an NSMD interconnect, an NSMD interconnect produces a more reliable joint structure. Therefore, by employing an NSMD interconnect, such as joint structures 202 and 234, the stress performance of the joint structure is better than SMD interconnects in WLCSP. NSMD interconnects in WLCSP reduce solder cracking and damage to solder bumps, such as bumps 180 and 216, and damage to RDL pads, such as conductive pads 162.

Figure 9E:
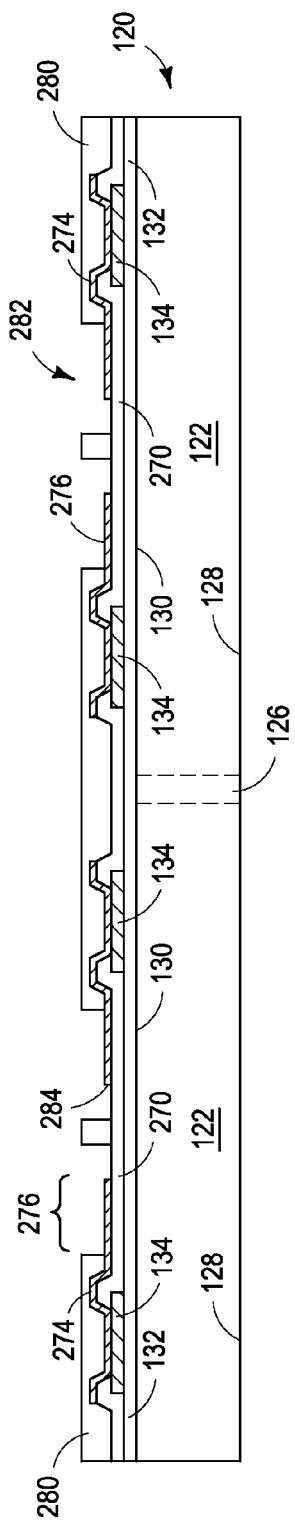

FIGS. 9a-9i illustrate, in relation to FIGS. 1 and 2a-2f, a process of forming a WLCSP. Continuing from FIG. 2f, FIG. 9a shows a cross-sectional view of a portion of semiconductor wafer 120. An insulating or passivation layer 270 is formed over active surface 130 of semiconductor wafer 120 using PVD, CVD, printing, spin coating, spray coating, sintering or thermal oxidation. Insulating layer 270 contains one or more layers of SiO2, Si3N4, SiON, Ta2O5, Al2O3, HfO2, BCB, PI, PBO, or other material having similar insulating and structural properties. In one embodiment, insulating layer 270 includes Si3N4 and USG. Insulating layer 270 covers active surface 130 of semiconductor wafer 120 and conductive layer 134. A portion of insulating layer 270 is removed from over conductive layer 134 to form openings 272 and expose a portion of conductive layer 134. In one embodiment, openings 272 are formed by patterning through a photolithography process. Alternatively, openings 272 are formed by an etching process or LDA to remove a portion of insulating layer 270 and expose conductive layer 134. A first portion of insulating layer 270 is removed from over conductive layer 134 while leaving a second portion of insulating layer 270 covering conductive layer 134. In one embodiment, insulating layer 270 includes a thickness of approximately 0.5 µm or less. In another embodiment, insulating layer 270 is formed with a thickness in the range of approximately 0.5-1.5 µm. In one embodiment, the material selected for insulating layer 270 includes a Young's modulus of 137.5 GPa, a Poisson's ratio of 0.206, and a CTE of 1.907 ppm/° C.

FIG. 9b shows a plan view of semiconductor wafer 120 from FIG. 9a. Insulating layer 270 overlies a portion of conductive layer 134, while openings 272 reveal a central portion of conductive layer 134 to expose the central portion of conductive layer 134 with respect to insulating layer 270.

In FIG. 9c, an electrically conductive layer 274 is formed over insulating layer 270 and conductive layer 134 using PVD, CVD, electrolytic plating, electroless plating, or other suitable metal deposition process. Conductive layer 274 contains one or more layers of Al, Cu, Sn, Ni, Au, Ag, Ti, W, TiW, TiCu, TiWCu, TaNCu, or other suitable electrically conductive material. A portion of conductive layer 274 is electrically connected to conductive layer or contact pads 134. Conductive layer 274 is conformally applied to and follows the contours of insulating layer 270 and is formed within openings 272 in insulating layer 270. Portions of conductive layer 274 can be electrically common or electrically isolated depending on the design and function of semiconductor die 124. Conductive layer 274 operates as an RDL to redistribute electrical connection from the semiconductor die. Conductive layer 274 can be a multi-metal stack with an adhesion layer, a barrier layer, and a seed or wetting layer. In one embodiment, conductive layer 274 includes Cu. In another embodiment, the material selected for conductive layer 274 includes a Young's modulus of 110 GPa, a Poisson's ratio of 0.34, and a CTE of 17 ppm/° C. In one embodiment, conductive layer 274 is formed having a thickness ranging from approximately 4-8.6 µm.

FIG. 9d shows a plan view of semiconductor wafer 120 from FIG. 9c. A portion of conductive layer 274 forms conductive pads or RDL pads 276. Conductive pads 276 operate as interconnect sites on conductive layer 274 for subsequently formed interconnect structures. In one embodiment, conductive pads 276 include a diameter ranging from approximately 200-280 µm. In another embodiment, conductive pads 276 include a diameter of approximately 240 µm. In yet another embodiment, conductive pads 276 include a diameter of approximately 257 µm.

In FIG. 9e, an insulating or dielectric layer 280 is formed over insulating layer 270 and conductive layer 274 and over active surface 130 of semiconductor wafer 120 using PVD, CVD, printing, spin coating, spray coating, sintering or thermal oxidation. Insulating layer 280 contains one or more layers of SiO2, Si3N4, SiON, Ta2O5, Al2O3, HfO2, BCB, PI, PBO, or other material having similar insulating and structural properties. In one embodiment, insulating layer 280 includes a thickness of approximately 7.5 µm or greater. In another embodiment, insulating layer 280 is formed with a thickness in the range of approximately 10-15 µm. In one embodiment, the material selected for insulating layer 280 includes a Young's modulus of 2.3 GPa, a Poisson's ratio of 0.3, and a CTE of 64 ppm/° C.

A portion of insulating layer 280 is removed from over conductive layer 274 by forming openings 282 in insulating layer 280 to expose a portion of conductive layer 274. Insulating layer 280 covers a portion of conductive layer 274 while leaving exposed conductive pads 276. A portion of insulating layer 280 is removed from over conductive pads 276 and from an area adjacent to conductive pads. Openings 282 extend completely through insulating layer 280 to conductive layer 274 and insulating layer 270. Insulating layer 280 is removed from a peripheral region of conductive pads 276 such that a side surface 284 of conductive pads 276 is exposed with respect to insulating layer 280.

Figure 9F:
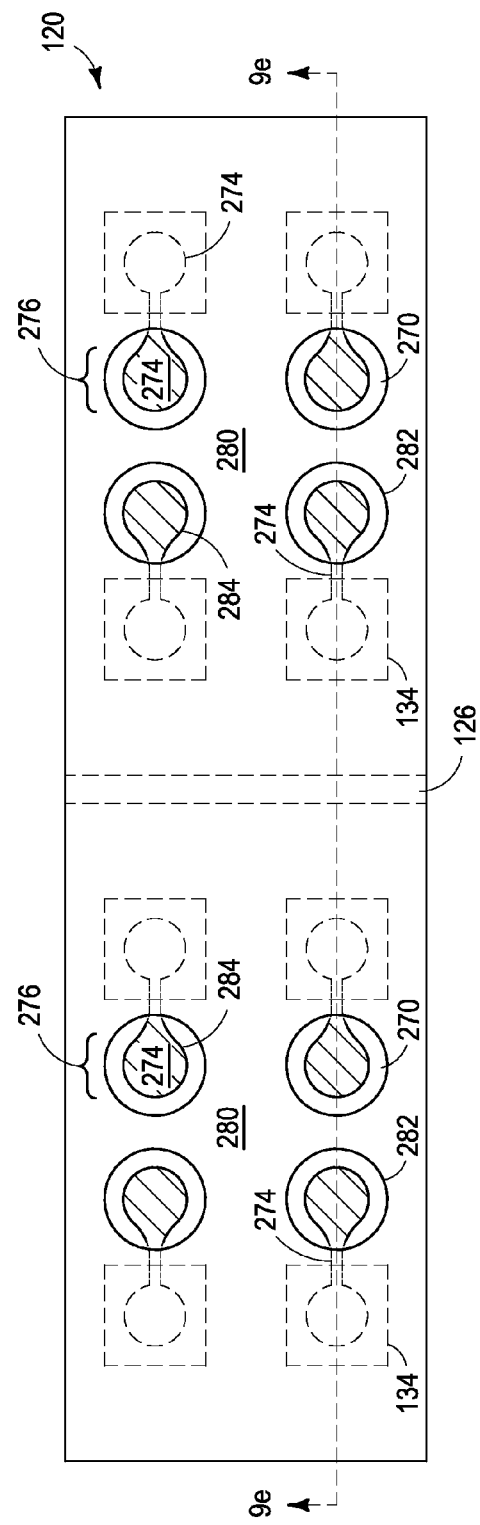

FIG. 9f shows a plan view of semiconductor wafer 120 from FIG. 9e. Openings 282 reveal conductive pads 276 and a portion of insulating layer 270 adjacent to conductive pads 276. In one embodiment, openings 282 are formed having a diameter greater than a diameter of conductive pads 276. Where openings 282 are larger than conductive pads 276, the interconnect sites, which include conductive pads 276, constitute NSMD interconnects. In one embodiment, openings 282 include a diameter ranging from approximately 200-240 µm. In another embodiment, openings 282 are formed having a diameter similar to or equal to a diameter of conductive pads 276. Where openings 282 are equal to or smaller in diameter to conductive pads 276, the interconnect sites, which include conductive pad 276, constitute SMD interconnects. In another embodiment, openings 282 include a diameter ranging from approximately 180-210 µm. In yet another embodiment, openings 282 include a diameter of up to approximately 270 µm.

Figure 9G:
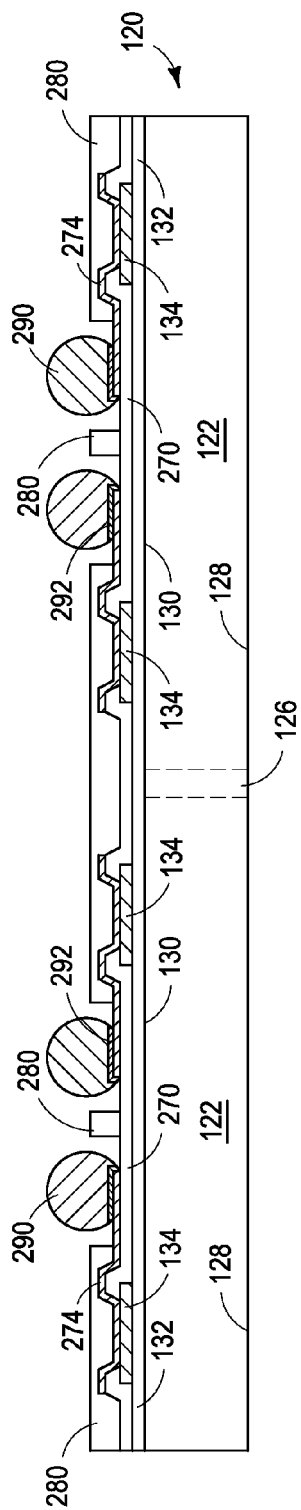

In FIG. 9g, an electrically conductive bump material is deposited over conductive layer 274 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 274 using a suitable attachment or bonding process. In one embodiment, the bump material is reflowed by heating the material above its melting point to form balls or bumps 290. In some applications, bumps 290 are reflowed a second time to improve electrical contact to conductive layer 274. Bumps 290 can also be compression bonded or thermocompression bonded to conductive layer 274. Bumps 290 represent one type of interconnect structure that can be formed over conductive layer 274. The interconnect structure can also use bond wires, conductive paste, stud bump, micro bump, or other electrical interconnect. In one embodiment, bumps 290 include 95.5Sn4Ag0.5Cu lead-free solder. In one embodiment, the material selected for bumps 290 includes a Poisson's ratio of 0.35 and a Young's modulus of 46.625 GPa at −65° C., 43.625 GPa at −25° C., 39.875 GPa at 25° C., 36.125 GPa at 75° C., and 32.375 GPa at 125° C. In another embodiment, the material selected for bumps 290 includes a CTE of 20.196 ppm/° C. at −65° C., 20.876 ppm/° C. at −25° C., 21.726 ppm/° C. at 25° C., 22.576 ppm/° C. at 75° C., and 23.426 ppm/° C. at 125° C.

Bumps 290 contact an upper surface and side surface 284 of conductive pads 276 and conductive layer 274. In an NSMD interconnect, bumps 290 may also contact insulating layer 270 in an area adjacent to conductive pads 276. During the process of bonding interconnect structures or bumps 290 to conductive layer 274, bumps 290 react with conductive layer 274 to form an IMC 292 at the interface of bump 290 and conductive layer 274. IMC 292 forms between bump 290 and conductive layer 274. Where bumps 290 include Sn and conductive layer 274 includes Cu, IMC 292 is formed as Cu6Sn5 or Cu3Sn including a Young's modulus of 136 GPa, a Poisson's ratio of 0.25, and a CTE of 18.2 ppm/° C. In one embodiment, IMC 292 has a thickness ranging from approximately 1-5 µm.

Figure 9H:
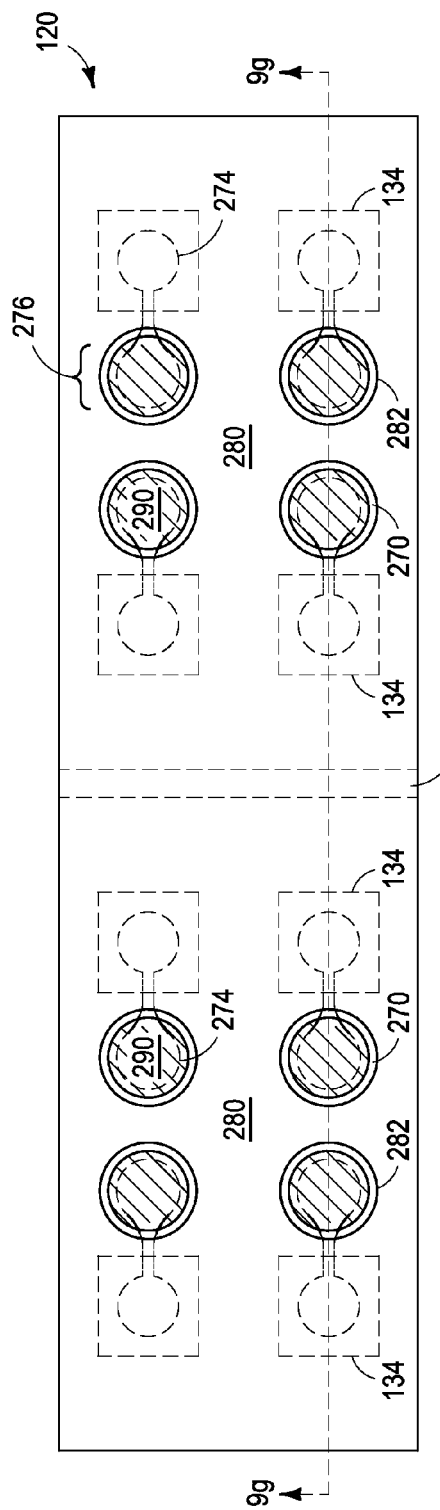

FIG. 9h shows a plan view of a portion of semiconductor wafer 120 from FIG. 9g. Bumps 290 are formed over conductive pads 276. In one embodiment, bumps 290 include a diameter greater than a diameter of conductive pads 276 and further include a diameter smaller than a diameter of openings 282 in insulating layer 280. Accordingly, the interconnect structure including bump 290 disposed over conductive pad 276 within opening 282 constitutes an NSMD interconnect. Bumps 290 contact an upper surface and side surface 284 of conductive layer 274 to improve the joint reliability between bumps 290 and conductive layer 274. In another embodiment, bumps 290 include a diameter ranging from approximately 220-280 µm. In one embodiment, bumps 290 are formed having a pitch ranging from approximately 300-400 µm. In another embodiment, bumps 290 include a diameter of approximately 250 µm and a pitch of approximately 400 µm. In one embodiment, bumps 290 include a height in the range of approximately 150-210 µm.

Figure 9I:
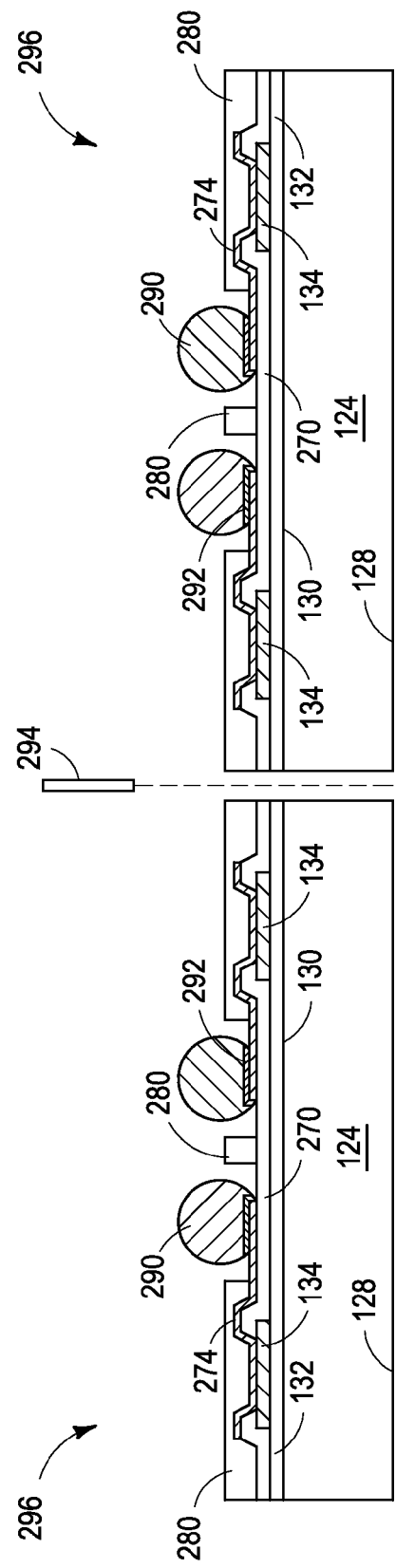

In FIG. 9i, semiconductor wafer 120 is singulated through saw street 126 using a saw blade or laser cutting tool 294 into individual WLCSP 296. The individual semiconductor die 124 of WLCSP 296 can be inspected and electrically tested for identification of KGD post singulation.

Figure 10A:
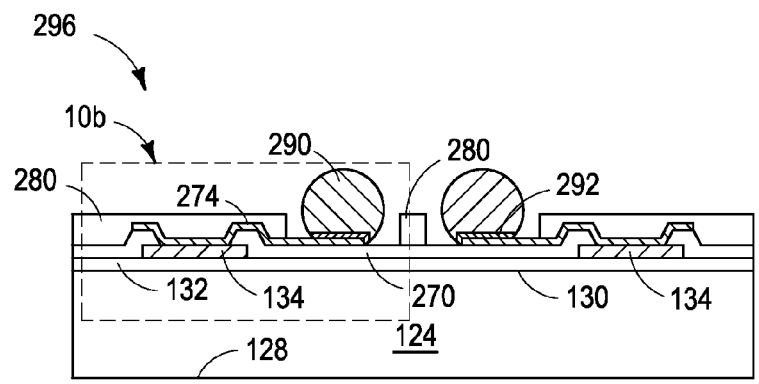
FIGS. 10a-10f illustrate a WLCSP including a non-solder mask defined interconnect site.

FIGS. 10a-10f illustrate, in relation to FIGS. 1, 2a-2f, and 9a-9i, a process of mounting a WLCSP to a substrate. Continuing from FIG. 9i, FIG. 10a shows semiconductor die 124 of WLCSP 296 after singulation. WLCSP 296 is formed with a low cost process by using fewer processing steps than a conventional WLCSP. The method of forming WLCSP 296 uses fewer steps than current WLCSP processes. In particular, the process of forming WLCSP 296 is accomplished with fewer masking steps and fewer insulating layers. WLCSP 296 is formed with fewer insulating layers and conductive layers, thereby reducing the number of masking steps by 50%. Additionally, the step of forming a UBM over the RDL pad and prior to forming the bump is eliminated. Therefore, WLCSP 296 can be produced more cost-effectively without additional masking steps or UBM formation. Elimination of masking and UBM steps reduces the cost of manufacturing WLCSP 296. WLCSP 296 has better performance and reliability than other low-cost WLCSP because the interconnect structure reduces stress on insulating layers 132 and 270, IMC 292, bump 290, and semiconductor die 124, thereby reducing damage to the joint structures due to thermo-mechanical stress.

Figure 10B:
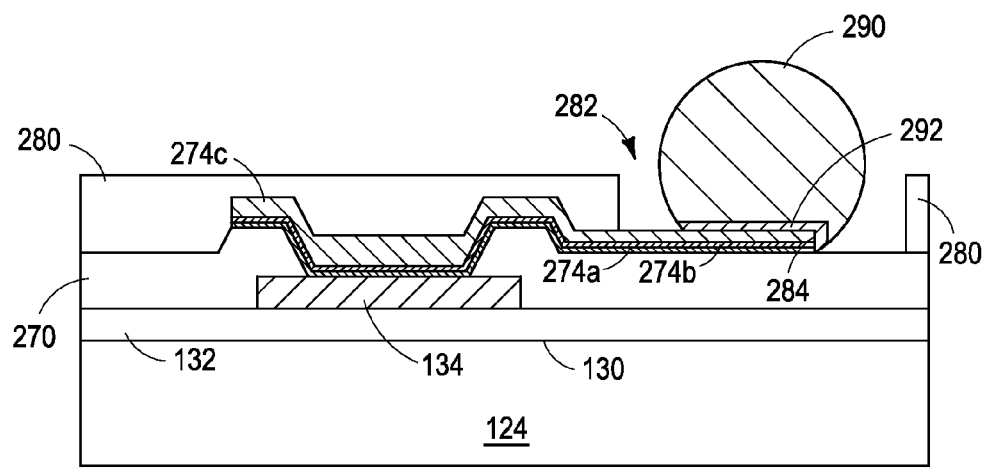

FIG. 10b shows a portion of WLCSP 296 in greater detail. Conductive layer 274 is shown having one or more layers of conductive material. In one embodiment, conductive layer 274 includes a UBM layer with a wetting or adhesion layer 274a, a barrier layer 274b, and a seed layer 274c. Adhesion layer 274a is formed over conductive layer 134 and can be Ti, Al, TiW, TiN, or Cr. Barrier layer 274b is formed over adhesion layer 274a and can be Ni, Ti, TiW, TaN, NiV, Pt, Pd, CrCu, or other suitable barrier material. Barrier layer 274b inhibits the diffusion of Cu into the active area of semiconductor die 124. Seed layer 274c is formed over barrier layer 274b and can be Cu, Ni, NiV, Au, or Al. Conductive layer 274 provides a low resistive interconnect to conductive layer 134, as well as a barrier to solder diffusion and a seed layer for solder wettability.

Figure 10C:
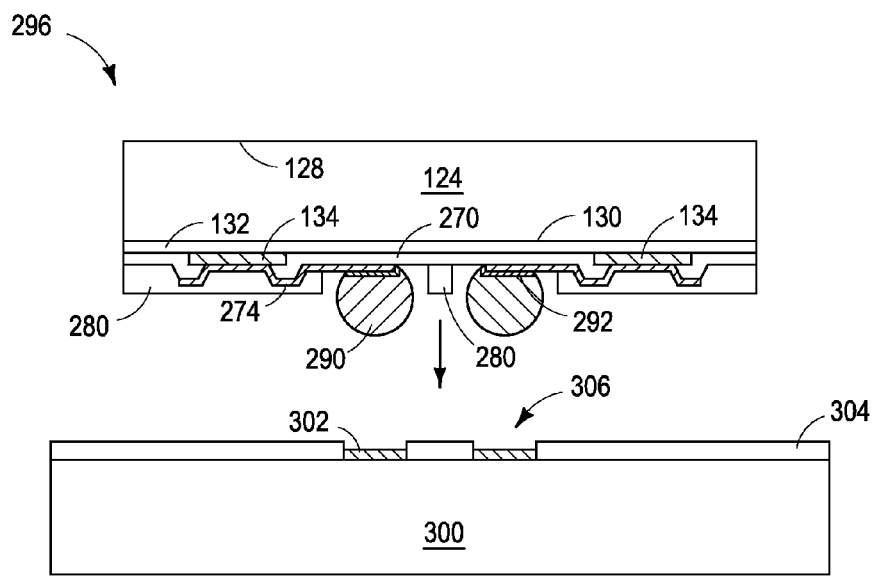

FIG. 10c shows a substrate or PCB 300 containing one or more laminated layers of prepreg, FR-4, FR-1, CEM-1, CEM-3, or other material having similar insulating and structural properties. Substrate 300 may include an epoxy, resin, or polymer with a reinforcement fiber or fabric, such as phenolic cotton paper, epoxy, resin, woven glass, matte glass, polyester, and other reinforcement fibers or fabrics. Substrate 300 can also be a multi-layer flexible laminate, ceramic, copper foil, glass, or semiconductor wafer including an active surface containing one or more transistors, diodes, and other circuit elements to implement analog circuits or digital circuits. Substrate 300 may include a base substrate material such as silicon, germanium, aluminum phosphide, aluminum arsenide, gallium arsenide, gallium nitride, indium phosphide, silicon carbide, or other bulk semiconductor material for structural support. Substrate 300 may include insulating and conductive layers formed over or within substrate 300 depending on the functionality and specifications of substrate 300 and semiconductor die 124. In one embodiment, the material selected for substrate 300 includes FR-4 and includes a Young's modulus of 22 GPa, a Poisson's ratio of 0.28, and a CTE of 18.5 ppm/° C. In one embodiment, substrate 300 includes a length of 10 mm and a width of 10 mm. In another embodiment, substrate 300 includes a thickness ranging from approximately 800-1600 μm.

An electrically conductive layer 302 is formed over substrate 300 using PVD, CVD, electrolytic plating, electroless plating process, or other suitable metal deposition process. Conductive layer 302 can be one or more layers of Al, Cu, Sn, Ni, Au, Ag, or other suitable electrically conductive material. Conductive layer 302 operates as contact pads, pins, or traces electrically connected to substrate 300. Conductive layer 302 can be disposed as contact pads side-by-side a first distance from the edge of substrate 300. Alternatively, conductive layer 302 can be offset in multiple rows such that conductive layer 302 includes a first row of contact pads disposed a first distance from the edge of the substrate 300, and a second row of contact pads alternating with the first row and disposed a second distance from the edge of substrate 300. In one embodiment, conductive layer 302 includes a diameter of approximately 220 μm and a thickness of approximately 25 μm. In another embodiment, conductive layer 302 includes a diameter ranging from approximately 200-240 μm. In another embodiment, conductive layer 302 includes a thickness ranging from approximately 15-35 μm.

An insulating or passivation layer 304 is formed over substrate 300 and conductive layer 302 using PVD, CVD, printing, spin coating, spray coating, sintering or thermal oxidation. Insulating layer 304 contains one or more layers of SiO2, Si3N4, SiON, Ta2O5, Al2O3, HfO2, BCB, PI, PBO, or other suitable insulating material. In one embodiment, insulating layer 304 includes a solder resist and includes a thickness of 30 μm. In another embodiment, insulating layer 304 includes a thickness ranging from approximately 20-40 μm. In one embodiment, the material selected for insulating layer 304 includes a Young's modulus of 3.2 GPa, a Poisson's ratio of 0.4, a CTE of 58 ppm/° C. below a glass transition temperature of 105° C., and a CTE of 153 ppm/° C. above a glass transition temperature of 105° C.

A portion of insulating layer 304 is removed from over conductive layer 302 to form openings 306 and expose conductive layer 302. In one embodiment, openings 306 are formed by patterning or by an etching process through a photo mask. Alternatively, openings 306 are formed by a photolithography process or LDA to remove a portion of insulating layer 304. In one embodiment, openings 306 have a diameter similar to a diameter of conductive layer 302. In another embodiment, openings 306 are larger than conductive layer 302 to expose a portion of substrate 300 adjacent to conductive layer 302. In another embodiment, openings 306 include a diameter of approximately 300 μm. In yet another embodiment, openings 306 include a diameter ranging from approximately 280-320 μm. Where openings 306 include a diameter greater than a diameter of conductive layer 302, the interconnect site constitutes an NSMD interconnect. Where openings 306 include a diameter less than a diameter of conductive layer 302, the interconnect site constitutes an SMD interconnect.

WLCSP 296 including semiconductor die 124 is mounted to substrate 300 using a pick and place operation with active surface 130 and bumps 290 oriented toward substrate 300.

Figure 10D:
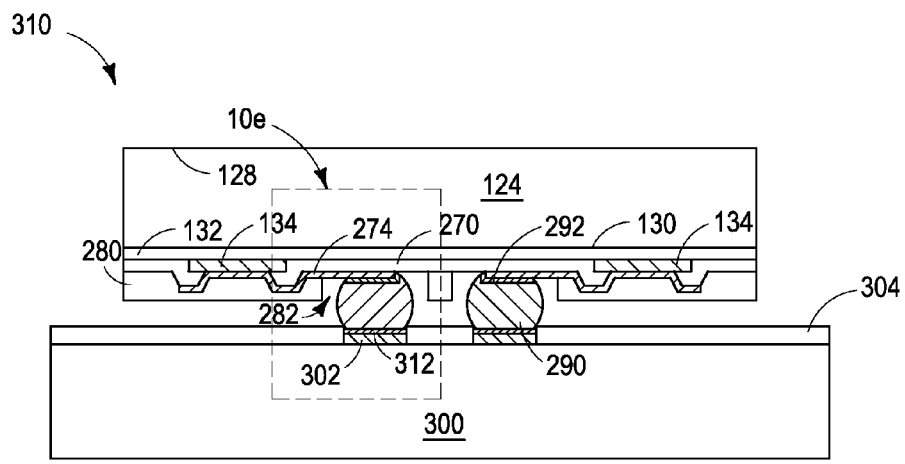

FIG. 10d shows semiconductor die 124 mounted to substrate 300. WLCSP 296 with semiconductor die 124 is mounted to substrate 300 to form semiconductor package 310. Additional electrically conductive layers and insulating layers may be formed over substrate 300 prior to mounting semiconductor die 124. Bumps 290 are electrically connected to conductive layer 302. Bumps 290 are bonded to conductive layer 302 using a suitable attachment or bonding process. In one embodiment, bumps 290 are reflowed by heating the bump material above its melting point. In some applications, bumps 290 are reflowed a second time to improve electrical contact to conductive layer 302. Bumps 290 can also be compression bonded to conductive layer 302.

During the process of bonding interconnect structures or bumps 290 to conductive layer 302, bumps 290 react with conductive layer 302 to form an IMC 312 at the interface of bump 290 and conductive layer 302. IMC 312 forms between bump 290 and conductive layer 302. Where bumps 290 include Sn and conductive layer 302 includes Cu, IMC 312 is formed as Cu6Sn5 or Cu3Sn and includes a Young's modulus of 136 GPa, a Poisson's ratio of 0.25, and a CTE of 18.2 ppm/° C. In one embodiment, IMC 312 has a thickness ranging from approximately 1-5 μm.

Figure 10E:
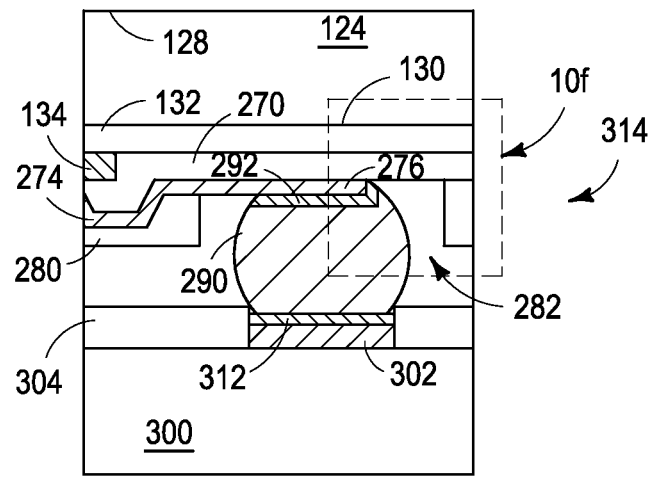

FIG. 10e shows a joint structure of semiconductor package 310 from FIG. 10d in greater detail. In FIG. 10e, joint structure 314 includes conductive pad 276, insulating layers 132, 270, and 280, and bump 290 formed over semiconductor die 124. Joint structure 314 further includes conductive layer 302 and insulating layer 304 formed over substrate 300. In one embodiment, substrate 300 includes a thickness of 1.6 mm, insulating layer 304 includes a thickness of 30 μm with an opening 306 diameter of 300 μm, and conductive layer 302 includes a thickness of 25 μm and a diameter of 220 μm. Bump 290 is disposed over and electrically connected to conductive pad 276 and conductive layer 302. Bumps 290 contact conductive pad 276 and IMC 292 forms between bumps 290 and conductive pad 276. Bumps 290 further contact conductive layer 302 and IMC 312 forms between bumps 290 and conductive layer 302. In one embodiment, bump 290 includes 95.5Sn4Ag0.5Cu lead-free solder and includes a diameter of 250 μm and is disposed between semiconductor die 124 and substrate 300 at a pitch of 400 μm.

Joint structure 314 comprises an NSMD interconnect on the side of bump 290 adjacent to semiconductor die 124. Joint structure 314 is configured to reduce the stress at the interface between bump 290 and semiconductor die 124, in particular, the stress on insulating layers 132 and 270, conductive pad 276, IMC 292, and bump 290. Joint structure 314 is further configured to reduce the stress at the interface between bump 290 and substrate 300, in particular, the stress on conductive layer 302, IMC 312, and bump 290.

Controlling the stress at insulating layer 132 improves reliability of joint structure 314. Stress at insulating layer 132 is reduced by increasing the size of RDL pad, such as conductive pad 276. Where a diameter of conductive pad 276 is increased from 240 µm to 280 µm, stress at insulating layer 132 is reduced by 20%. Similarly, where a diameter of conductive pad 276 is decreased from 240 µm to 200 µm, stress at insulating layer 132 increases by 60%. Therefore, RDL pad size affects the stress at insulating layer 132 by reducing stress as RDL pad size increases. The size of openings 282 in insulating layer 280, the thickness of insulating layer 132, and the diameter of bumps 290 also affect the stress at insulating layer 132. Where the diameter of openings 282 is decreased from 240 µm to 200 µm, stress at insulating layer 132 is reduced by 8%. Where the thickness of insulating layer 132 is increased by 2 µm, stress at insulating layer 132 is reduced by approximately 6-8%. Where the diameter of bumps 290 decreases by 30 µm, stress at insulating layer 132 is reduced by approximately 4-5%. Additional design factors that result in reduced stress at insulating layer 132 include decreasing the thickness of substrate 300, decreasing the thickness of semiconductor die 124, decreasing the pitch of bumps 290, and selecting a material for insulating layer 132 including a lower Young's modulus, i.e., less than 20 GPa.

Controlling the stress at IMC 292 improves reliability of joint structure 314. Stress at IMC 292 is reduced by forming opening 282 in insulating layer 280 with a diameter similar to a diameter of conductive pad 276. For example, where conductive pad 276 includes a diameter of 240 µm, opening 282 in insulating layer 280 with a diameter of 240 µm results in reduced stress at IMC 292 compared to larger or smaller openings 282. The size or diameter of conductive pad 276 also affect the stress at IMC 292. Where a diameter of conductive pad 276 is greater than 250 µm, the stress at IMC 292 is less than where a diameter of conductive pad 276 is less than 210 µm. In other words, stress at IMC 292 is lower in an SMD interconnect than in an NSMD interconnect. Additional design factors that result in reduced stress at IMC 292 include decreasing the pitch of bumps 290, decreasing the thickness of IMC 292, decreasing the thickness of substrate 300 or semiconductor die 124, and increasing the diameter of conductive layer 302. Reducing stress at IMC 292 results in improved reliability of bumps 290 by reducing cracking in bumps 290 at the die side.

Controlling the stress at conductive pad 276 improves reliability of joint structure 314. Stress at conductive pad 276 is reduced by decreasing the size of conductive pad 276. Where a size of conductive pad 276 is selected to be smaller to form an NSMD interconnect, rather than a larger conductive pad 276 to form an SMD structure, the stress at conductive pads 276 is reduced by 20%. Where a diameter of conductive pad 276 is increased or decreased from 250 µm, the stress at conductive pads 276 is reduced. Where insulating layer 280 is formed directly on insulating layer 270, i.e., where no insulating layer is formed between insulating layers 270 and 280, an NSMD interconnect rather than an SMD interconnect results in the greatest reduction in stress at conductive pad 276.

Controlling the stress at IMC 312 improves reliability of joint structure 314. Stress at IMC 312 is reduced by decreasing the thickness of substrate 300. Reducing stress at IMC 312 results in improved reliability of bumps 290 by reducing cracking in bumps 180 at the substrate side. Additional design factors that result in reduced stress at IMC 312 include decreasing the pitch of bumps 290, increasing the thickness of IMC 312, and increasing the diameter of bumps 290. In addition, the size of semiconductor die 124 influences the stress response of joint structure 314. For a semiconductor die 124 size of 5.3 mm by 5.8 mm and a substrate 300 size of 10 mm by 10 mm, stress occurs in insulating layer 132, conductive pad 276, IMC 292, and IMC 312. Stress in insulating layer 132, conductive pad 276, IMC 292, and IMC 312 is reduced by over 40% where semiconductor die 124 size is increased to 10 mm by 10 mm or decreased to 2 mm by 2 mm. Stress in insulating layer 132, conductive pad 276, IMC 292, and IMC 312 is reduced by approximately 10% where semiconductor die 124 size is increased to 8 mm by 8 mm or decreased to 4 mm by 4 mm as compared with a semiconductor die 124 size of 5.3 mm by 5.8 mm. Therefore, semiconductor package 310 including joint structure 314 results in a more reliable interconnect structure, because stress on joint structure 314 is reduced resulting in less damage to joint structure 314.

Figure 10F:
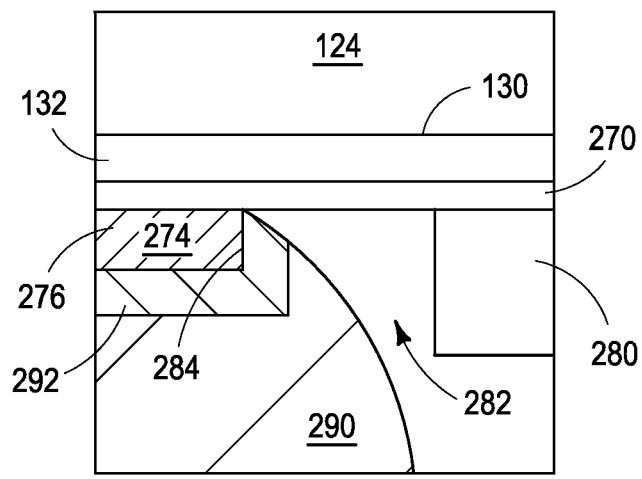

FIG. 10f shows a portion of joint structure 314 from semiconductor package 310 from FIG. 10e. Joint structure 314 comprises an NSMD interconnect. In one embodiment, semiconductor die 124 includes a thickness of 330 µm and dimensions of 5.3 mm by 5.8 mm. Insulating layer 132 includes a thickness of 5 µm, insulating layer 270 includes a thickness of 0.5 µm, conductive pad 276 includes a thickness of 8.0 µm and a diameter of 257 µm, insulating layer 280 includes a thickness 10 µm and with an opening 282 diameter of 240 µm.

Figure 11:
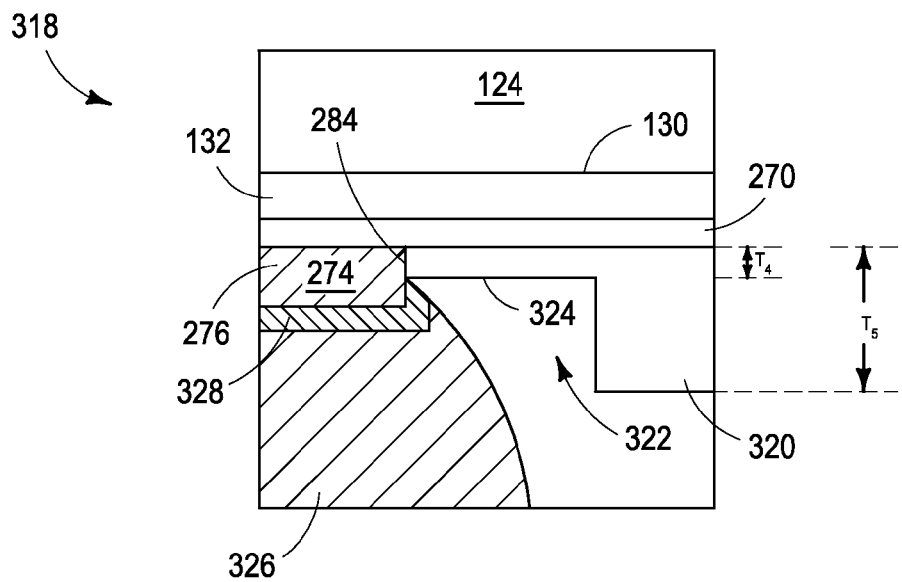
FIG. 11 illustrates another WLCSP including a non-solder mask defined interconnect site.

FIG. 11 shows an alternative NSMD joint structure for a WLCSP. Joint structure 318 constitutes an NSMD interconnect and includes insulating layer 132 formed over active surface 130 of semiconductor die 124 at the wafer level. Conductive layer 134 is formed over insulating layer 132. In one embodiment, conductive layer 134 operates as contact pads electrically connected to the circuits on active surface 130. Insulating layer 270 is formed over insulating layer 132 and over conductive layer 134. In one embodiment, insulating layer 270 operates as a passivation layer disposed over semiconductor die 124. An opening in insulating layer 270 exposes conductive layer 134 for subsequent electrical interconnection. Conductive layer 274 is formed over insulating layer 270 and contacts the exposed portion of conductive layer 134. Portions of conductive layer 274 can be electrically common or electrically isolated depending on the design and function of the semiconductor die of semiconductor wafer 120. Conductive layer 274 operates as an RDL to redistribute electrical connection from the semiconductor die.

An insulating or passivation layer 320 is formed over insulating layer 270 and conductive layer 274 and over active surface 130 of semiconductor wafer 120 using PVD, CVD, printing, spin coating, spray coating, sintering or thermal oxidation. Insulating layer 320 contains one or more layers of $SiO_2$, $Si_3N_4$, SiON, $Ta_2O_5$, $Al_2O_3$, $HfO_2$, BCB, PI, PBO, or other material having similar insulating and structural properties. In one embodiment, insulating layer 320 includes a thickness $T_5$ of approximately 7.5 µm or greater. In another embodiment, insulating layer 320 is formed with a thickness $T_5$ in the range of approximately 10-15 µm. In one embodiment, the material selected for insulating layer 320 includes a Young's modulus of 2.3 GPa, a Poisson's ratio of 0.3, and a CTE of 64 ppm/° C.

A portion of insulating layer 320 is removed from over conductive layer 274 to form openings 322 and expose a portion of conductive layer 274. Insulating layer 320 covers a portion of conductive layer 274 while leaving exposed conductive pads 276. Openings 322 extend completely through insulating layer 320 in an area directly over conductive pads 276. Openings 322 extend partially through insulating layer 320 to surface 324 in an area adjacent to conductive pads 276. A portion of insulating layer 320 remains disposed over and partially covering side surface 284 of conductive layer 274 and conductive pads 276. A portion of side surface 284 of conductive layer 274 is exposed with respect to insulating layer 320. Insulating layer 320 includes a thickness $T_5$ over insulating layer 270 that is greater than a thickness $T_4$ of insulating layer 320 directly adjacent to conductive pad 276. Surface 324 of insulating layer 320 defines a thickness $T_4$ of insulating layer 320 which contacts side surface 284 of conductive pads 276.

An electrically conductive bump material is deposited over conductive layer 274 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 274 using a suitable attachment or bonding process. In one embodiment, the bump material is reflowed by heating the material above its melting point to form balls or bumps 326. In some applications, bumps 326 are reflowed a second time to improve electrical contact to conductive layer 274. Bumps 326 can also be compression bonded or thermocompression bonded to conductive layer 274. Bumps 326 represent one type of interconnect structure that can be formed over conductive layer 274. The interconnect structure can also use bond wires, conductive paste, stud bump, micro bump, or other electrical interconnect. In one embodiment, bumps 326 include 95.5Sn4Ag0.5Cu lead-free solder. In one embodiment, the material selected for bumps 326 includes a Poisson's ratio of 0.35 and a Young's modulus of 46.625 GPa at −65° C., 43.625 GPa at −25° C., 39.875 GPa at 25° C., 36.125 GPa at 75° C., and 32.375 GPa at 125° C. In another embodiment, the material selected for bumps 326 includes a CTE of 20.196 ppm/° C. at −65° C., 20.876 ppm/° C. at −25° C., 21.726 ppm/° C. at 25° C., 22.576 ppm/° C. at 75° C., and 23.426 ppm/° C. at 125° C.

Bumps 326 contact an upper surface and side surface 284 of conductive pads 276 and conductive layer 274. During the process of bonding interconnect structures or bumps 326 to conductive layer 274, bumps 326 react with conductive layer 274 to form an IMC 328 at the interface of bump 326 and conductive layer 274. IMC 328 forms between bump 326 and conductive layer 274. Where bumps 326 include Sn and conductive layer 274 includes Cu, IMC 328 is formed as Cu6Sn5 or Cu3Sn including a Young's modulus of 136 GPa, a Poisson's ratio of 0.25, and a CTE of 18.2 ppm/° C. In one embodiment, IMC 328 has a thickness ranging from approximately 1-5 μm.

Where a thickness $T_4$ of insulating layer 320 directly adjacent to conductive pads 276 is less than a thickness $T_5$ of conductive pads 276 such that a side surface 284 of conductive pads 276 is partially exposed, an NSMD interconnect is formed. In one embodiment, semiconductor die 124 includes a thickness of 330 μm and dimensions of 5.3 mm by 5.8 mm. Insulating layer 132 includes a thickness of 5 μm, insulating layer 270 includes a thickness of 0.5 μm, and conductive pad 276 includes a thickness of 8.0 μm and a diameter of 257 μm. In one embodiment, insulating layer 320 includes a thickness $T_4$ of less than 10 μm in an area directly adjacent to conductive pad 276 and a thickness $T_5$ of 10 μm over insulating layer 270. Opening 322 in insulating layer 210 includes a diameter of 240 μm. In one embodiment, thickness $T_4$ of insulating layer 320 is less than thickness $T_5$ of insulating layer 320 in an area away from conductive pad 276. In another embodiment, thickness $T_4$ of insulating layer 320 adjacent to conductive pad 276 is less than a thickness of conductive pad 276. Bump 326 contacts conductive layer 274 at an upper surface and side surface 284 of conductive pad 276 to improve the joint reliability between bumps 326 and conductive layer 274.

Figure 12:
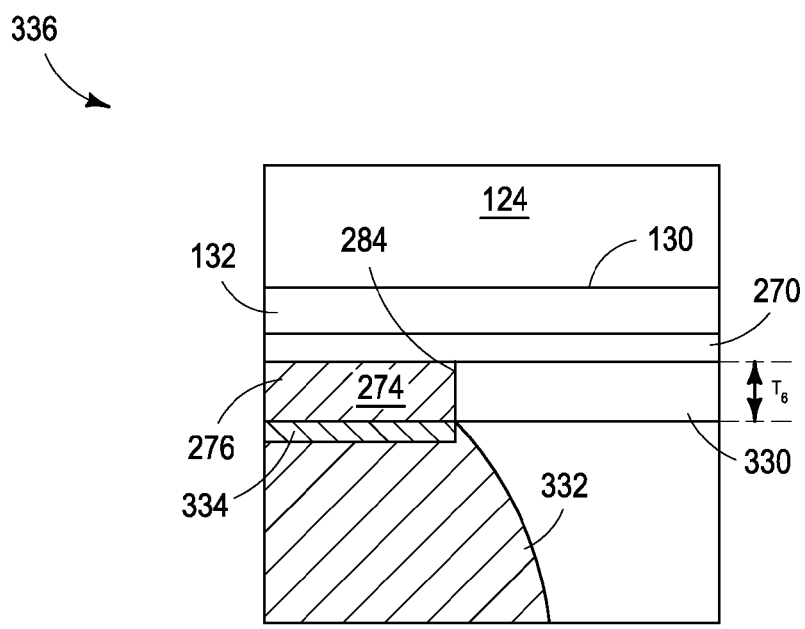
FIG. 12 illustrates another WLCSP including a solder mask defined interconnect site.

FIG. 12 shows an alternative joint structure for a WLCSP. Joint structure 336 includes insulating layer 132 formed over active surface 130 of semiconductor die 124 at the wafer level. Conductive layer 134 is formed over insulating layer 132. In one embodiment, conductive layer 134 operates as contact pads electrically connected to the circuits on active surface 130. Insulating layer 270 is formed over insulating layer 132 and over conductive layer 134. In one embodiment, insulating layer 270 operates as a passivation layer disposed over semiconductor wafer 120. An opening in insulating layer 270 exposes conductive layer 134 for subsequent electrical interconnection.

An insulating or dielectric layer 330 is formed over insulating layer 270 and conductive layer 274 and over active surface 130 of semiconductor die 124 using PVD, CVD, printing, spin coating, spray coating, sintering or thermal oxidation. Insulating layer 330 contains one or more layers of SiO2, Si3N4, SiON, Ta2O5, Al2O3, HfO2, BCB, PI, PBO, or other material having similar insulating and structural properties. In one embodiment, the material selected for insulating layer 330 includes a Young's modulus of 2.3 GPa, a Poisson's ratio of 0.3, and a CTE of 64 ppm/° C. In one embodiment, insulating layer 330 includes a thickness $T_6$ greater than a thickness of conductive pad 276. In another embodiment, insulating layer 330 includes a thickness $T_6$ equal to or similar to a thickness of conductive pad 276. In one embodiment, insulating layer 330 includes a thickness $T_6$ of approximately 7.5 μm or greater. In another embodiment, insulating layer 330 is formed with a thickness $T_6$ in the range of approximately 10-15 μm.

A portion of insulating layer 330 is removed from over conductive layer 274 to form openings and expose a portion of conductive layer 274. A portion of insulating layer 330 is removed from over conductive pads 276. Insulating layer 330 covers a portion of conductive layer 274 while leaving exposed conductive pads 276. In one embodiment, the openings in insulating layer 330 include a diameter similar or equal to a diameter of conductive pads 276. In another embodiment, the openings in insulating layer 330 include a diameter of approximately 240 μm.

An electrically conductive bump material is deposited over conductive layer 274 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 274 using a suitable attachment or bonding process. In one embodiment, the bump material is reflowed by heating the material above its melting point to form balls or bumps 332. In some applications, bumps 332 are reflowed a second time to improve electrical contact to conductive layer 274. Bumps 332 can also be compression bonded or thermocompression bonded to conductive layer 274. Bumps 332 represent one type of interconnect structure that can be formed over conductive layer 274. The interconnect structure can also use bond wires, conductive paste, stud bump, micro bump, or other electrical interconnect. In one embodiment, bumps 332 include 95.5Sn4Ag0.5Cu lead-free solder. In one embodiment, the material selected for bumps 332 includes a Poisson's ratio of 0.35 and a Young's modulus of 46.625 GPa at −65° C., 43.625 GPa at −25° C., 39.875 GPa at 25° C., 36.125 GPa at 75° C., and 32.375 GPa at 125° C. In another embodiment, the material selected for bumps 332 includes a CTE of 20.196 ppm/° C. at −65° C., 20.876 ppm/° C. at −25° C., 21.726 ppm/° C. at 25° C., 22.576 ppm/° C. at 75° C., and 23.426 ppm/° C. at 125° C.

Bump 332 is disposed over conductive pad 276. During the process of bonding interconnect structures or bumps 332 to conductive layer 274, bumps 332 react with conductive layer 274 to form an IMC 334 at the interface of bump 332 and conductive layer 274. IMC 334 forms between bump 332 and conductive layer 274. Where bumps 332 include Sn and conductive layer 274 includes Cu, IMC 334 is formed as Cu6Sn5 or Cu3Sn including a Young's modulus of 136 GPa, a Poisson's ratio of 0.25, and a CTE of 18.2 ppm/° C. In one embodiment, IMC 334 has a thickness ranging from approximately 1-5 μm. Where bumps 332 contact an upper surface of conductive pads 276 and the openings in insulating layer 330 have a diameter similar to or equal to a diameter of conductive pads 276, joint structure 336 is formed having reduced stress at insulating layers 132 and 270 and at IMC 334 and bumps 332.

Figure 13:
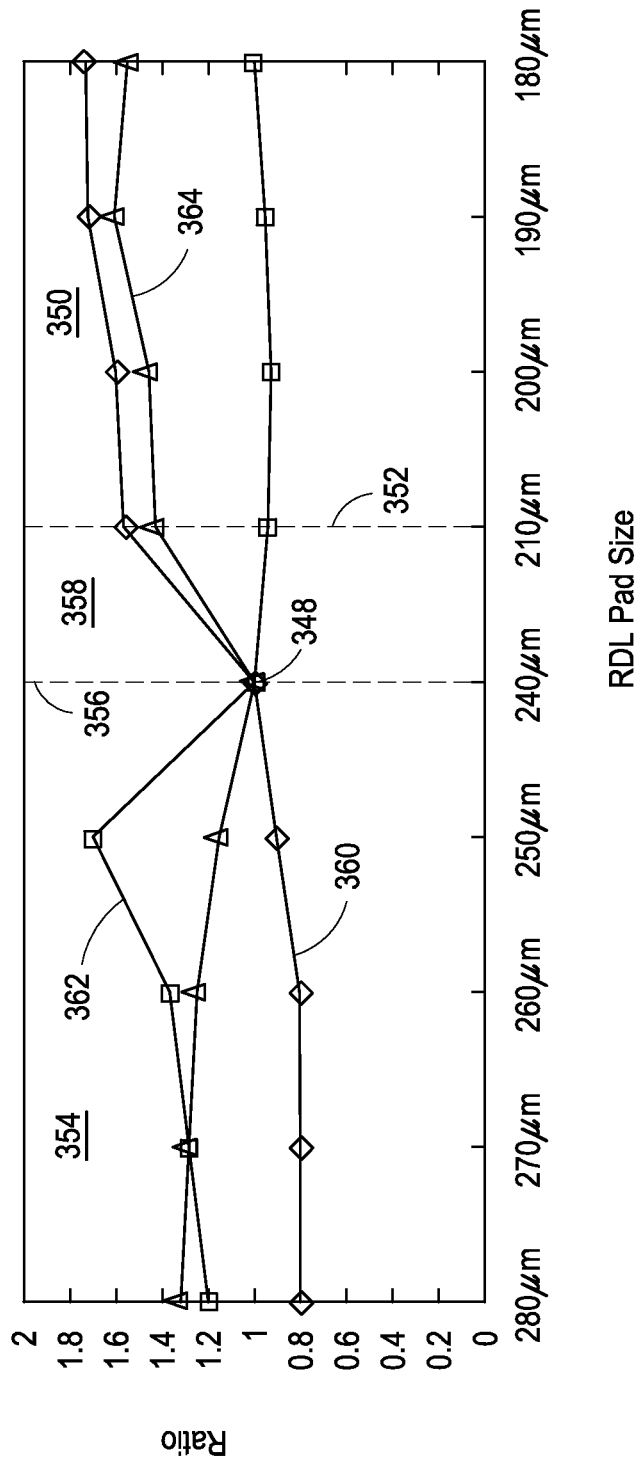
FIG. 13 illustrates a graphical representation of the stress on a WLCSP interconnect structure in relation to the size of RDL pad size.

FIG. 13 shows a graphical representation of the stress on a WLCSP interconnect structure in relation to the size of RDL pad. The stress response for joint structures having a 240 μm opening in the upper insulating layer, such as insulating layer 280, 320, or 330, is compared for various RDL pad sizes. To compare the stress response in SMD and NSMD joint structures, a stress response for a joint structure having a 240 μm RDL pad diameter and an insulating layer opening of 240 μm, such as joint structure 336 in FIG. 12, is normalized as a stress response ratio of 1 in the graph of FIG. 13. Therefore, joint structure 336 in FIG. 12 is illustrated as point 348 in FIG. 13, where conductive pad 276 and the opening in insulating layer 330 are similar or equal in diameter or size. Area 350 represents NSMD structures, such as joint structure 314 from FIG. 10e and joint structure 318 from FIG. 11. Where the RDL pad, such as conductive pad 276, includes a diameter of less than 210 μm, the joint structure is NSMD and the stress response ratio is shown in area 350, which is defined by line 352. Where the RDL pad, such as conductive pad 276, includes a diameter of greater than 240 μm and the joint structure is SMD, the stress response ratio is shown in area 354, which is defined by line 356. Area 358 between lines 356 and 352 represents an interconnect or joint structure where the RDL pad is between 210-240 μm, which is close to or similar to the insulating layer opening diameter of 240 μm. The stress response measured at the ELK layer, such as insulating layer 132, is shown by line 360. Line 360 shows that as the size of the RDL pad decreases with respect to the size of the corresponding opening in the insulating layer, such as insulating layer 280, 320, or 330, the stress in the ELK layer increases slightly.

The stress response measured at the RDL pads, such as conductive pads 276, is shown by line 362. Line 362 shows that as the size of the RDL pad decreases with respect to the size of the corresponding opening in the insulating layer, such as in insulating layer 280, 320, or 330, the stress at the RDL pads decreases at RDL pad sizes of less than 250 μm. The stress response measured at IMC on the die side, such as IMCs 292, 328, and 334, is shown by line 364. Line 364 shows that as the size of the RDL pad decreases with respect to the size of the corresponding opening in the insulating layer, the stress in the die-side IMC increases. Therefore, for WLCSP having fewer insulating layers, an NSMD interconnect reduces stress in the RDL pad while an SMD interconnect reduces stress in the ELK and IMC layers.

Where an NSMD interconnect structure is employed, rather than an SMD interconnect structure, the stress in the RDL pad is reduced. For example, where RDL pad size increases from 240 μm to 250 μm, the stress in the RDL pad increases by 50%, shown by line 362. Where RDL pad size increases from 250 μm, the stress in the RDL pad decreases, as shown by line 362. Further, decreasing the RDL pad size causes an increase in ELK layer stress and die-side IMC stress. Because an SMD interconnect results in a reduction in ELK layer stress and die-side IMC stress over an NSMD interconnect, an SMD interconnect produces a more reliable joint structure where ELK and IMC stress is a concern in the WLCSP structure. Further, an NSMD interconnect produces a more reliable joint structure where RDL pad stress is a concern in the WLCSP structure.

Figure 14:
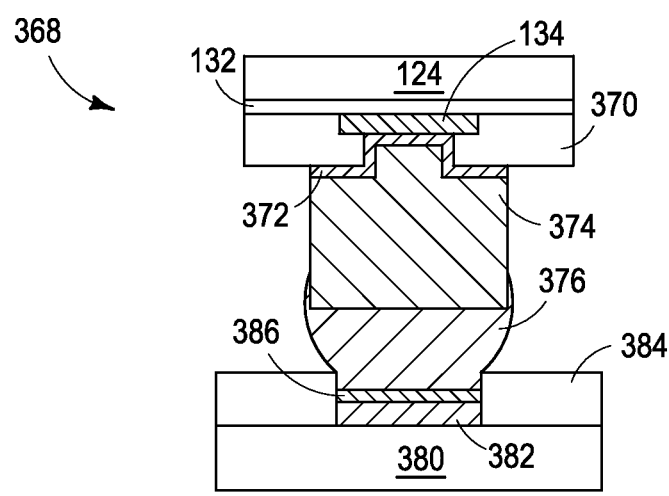
FIG. 14 illustrates a semiconductor package including a solder mask defined interconnect site over a substrate.

FIG. 14 shows an alternative joint structure for a WLCSP. Joint Structure 368 includes insulating layer 132 formed over an active surface of semiconductor die 124 at the wafer level. Conductive layer 134 is formed over insulating layer 132. In one embodiment, conductive layer 134 operates as contact pads electrically connected to the circuits on the active surface of semiconductor die 124.

An insulating or dielectric layer 370 is formed over insulating layer 132 and conductive layer 134 and over the active surface of semiconductor die 124 using PVD, CVD, printing, spin coating, spray coating, sintering or thermal oxidation. Insulating layer 370 contains one or more layers of SiO2, Si3N4, SiON, Ta2O5, Al2O3, HfO2, BCB, PI, PBO, or other material having similar insulating and structural properties. A portion of insulating layer 370 is removed from over conductive layer 134 to form openings and expose a portion of conductive layer 134. In one embodiment, the openings are formed by patterning or by an etching process through a photo mask. Alternatively, the openings are formed by a photolithography process or LDA to remove a portion of insulating layer 370.

An electrically conductive layer 372 is formed over insulating layer 370 and conductive layer 134 using PVD, CVD, electrolytic plating, electroless plating, or other suitable metal deposition process. Conductive layer 372 contains one or more layers of Al, Cu, Sn, Ni, Au, Ag, Ti, W, TiW, TiCu, TiWCu, TaNCu, or other suitable electrically conductive material. A portion of conductive layer 372 is electrically connected to conductive layer or contact pads 134. Conductive layer 372 is conformally applied to and follows the contours of insulating layer 370 and is formed within the openings in insulating layer 370. In one embodiment, conductive layer 372 operates as a UBM.

An electrically conductive material is deposited over conductive layer 372 using a patterning and metal deposition process such as printing, sputtering, electrolytic plating, and electroless plating to form conductive pillars or columns 374. The conductive material can be one or more layers of Al, Cu, Sn, Ti, Ni, Au, Ag, W, or other suitable electrically conductive material. Conductive columns 374 are electrically connected to conductive layer 134.

An electrically conductive bump material is deposited over conductive pillars 374 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 374 using a suitable attachment or bonding process. In one embodiment, the bump material is reflowed by heating the material above its melting point to form balls or bumps 376. In some applications, bumps 376 are reflowed a second time to improve electrical contact to conductive pillars 374. Bumps 376 can also be compression bonded or thermocompression bonded to conductive pillars 374. Bumps 376 represent one type of interconnect structure that can be formed over conductive pillars 374. The interconnect structure can also use bond wires, conductive paste, stud bump, micro bump, or other electrical interconnect. In one embodiment, bumps 376 include 95.5Sn4Ag0.5Cu lead-free solder.

Substrate 380 contains one or more laminated layers of prepreg, FR-4, FR-1, CEM-1, CEM-3, or other material having similar insulating and structural properties. Substrate 380 may include an epoxy, resin, or polymer with a reinforcement fiber or fabric, such as phenolic cotton paper, epoxy, resin, woven glass, matte glass, polyester, and other reinforcement fibers or fabrics. Substrate 380 can also be a multi-layer flexible laminate, ceramic, copper foil, glass, or semiconductor wafer including an active surface containing one or more transistors, diodes, and other circuit elements to implement analog circuits or digital circuits. Substrate 380 may include a base substrate material such as silicon, germanium, aluminum phosphide, aluminum arsenide, gallium arsenide, gallium nitride, indium phosphide, silicon carbide, or other bulk semiconductor material for structural support. Substrate 380 may include insulating and conductive layers formed over or within substrate 380 depending on the functionality and specifications of substrate 380 and semiconductor die 124.

An electrically conductive layer 382 is formed over substrate 380 using PVD, CVD, electrolytic plating, electroless plating process, or other suitable metal deposition process. Conductive layer 382 can be one or more layers of Al, Cu, Sn, Ni, Au, Ag, or other suitable electrically conductive material. Conductive layer 382 operates as contact pads, pins, or traces electrically connected to substrate 380.

An insulating or passivation layer 384 is formed over conductive layer 382 and substrate 380 using PVD, CVD, printing, spin coating, spray coating, sintering or thermal oxidation. Insulating layer 384 contains one or more layers of SiO2, Si3N4, SiON, Ta2O5, Al2O3, HfO2, BCB, PI, PBO, or other suitable insulating material. A portion of insulating layer 384 is removed by an etching process or LDA to form openings over conductive layer 382 and to expose conductive layer 382. The openings in insulating layer 384 constitute solder resist openings (SRO). In one embodiment, the SRO diameter is similar to a diameter of conductive layer 382. Where the SRO diameter is similar to, equal to, or less than a diameter of conductive layer 382, the interconnect site constitutes an SMD interconnect.

Semiconductor die 124 with bumps 376 is mounted to substrate 380 using a pick and place operation with the active surface and bumps 376 oriented toward substrate 380. Bumps 376 are electrically connected to conductive layer 382. Bumps 376 are bonded to conductive layer 382 using a suitable attachment or bonding process. In one embodiment, bumps 376 are reflowed by heating the bump material above its melting point. In some applications, bumps 376 are reflowed a second time to improve electrical contact to conductive layer 382. Bumps 376 can also be compression bonded to conductive layer 382. During the process of bonding interconnect structures or bumps 376 to conductive layer 382, bumps 376 react with conductive layer 382 to form an IMC 386 at the interface of bump 376 and conductive layer 382. IMC 386 forms between bump 376 and conductive layer 382.

The SMD interconnect on the substrate side reduces the risk of cracking and damage to bumps 376. Where a diameter of the SRO increases by 30 µm, and a diameter of conductive layer 382 decreases from 125 µm to 105 µm, the stress at bumps 376 is reduced by over 30%. An SRO size of larger than 120 µm, where the diameter of conductive layer 382 is 125 µm, reduces stress and cracking in bumps 376. Similarly, a diameter of less than 105 µm for conductive layer 382 where the SRO is 100 µm reduces stress and cracking in bumps 376. Where a ratio the diameter of conductive layer 382 to SRO size changes from 1.25 to 1.0, stress at bumps 376 decreases by 50%. Therefore, an SMD interconnect on a substrate produces a more reliable joint structure by reducing damage to bumps 376.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer;
   forming a redistribution layer over the semiconductor wafer, wherein the redistribution layer includes a top surface extending over a surface of the semiconductor wafer to include an interconnect site of the redistribution layer;
   forming a first insulating layer over the redistribution layer;
   forming an opening in the first insulating layer over the interconnect site; and
   forming an interconnect structure within the opening and over the interconnect site, wherein a first portion of the interconnect structure terminates on the top surface of the redistribution layer and a second portion of the interconnect structure opposite the first portion contacts a side surface of the redistribution layer.

2. The method of claim 1, further including:
   forming a second insulating layer over the semiconductor wafer prior to forming the redistribution layer; and
   forming the redistribution layer over the second insulating layer.

3. The method of claim 1, further including forming the opening in the first insulating layer partially through the first insulating layer in an area adjacent to the interconnect site.

4. The method of claim 1, further including:
   singulating the semiconductor wafer into individual semiconductor die; and
   disposing the semiconductor die over a substrate.

5. A method of making a semiconductor device, comprising:
   providing a semiconductor die;
   forming a first conductive layer over the semiconductor die, wherein the first conductive layer includes a top surface extending from a contact pad of the semiconductor die over a surface of the semiconductor die to include an interconnect site of the first conductive layer outside the contact pad;

forming a first insulating layer over the first conductive layer and including an opening over the interconnect site; and forming an interconnect structure over the interconnect site, wherein a first portion of the interconnect structure terminates on the top surface of the first conductive layer and a second portion of the interconnect structure opposite the first portion contacts a side surface of the first conductive layer.

6. The method of claim 5, further including:
forming a second insulating layer over the semiconductor die; and
forming the first conductive layer over the second insulating layer.

7. The method of claim 5, further including forming the opening in the first insulating layer partially through the first insulating layer in an area adjacent to the interconnect site.

8. The method of claim 5, wherein the opening in the first insulating layer is larger than the interconnect site.

9. The method of claim 5, further including:
forming a second conductive layer as contact pads over the semiconductor die;
forming a second insulating layer over the semiconductor die; and
forming the first conductive layer over the second conductive layer and second insulating layer.

10. A semiconductor device, comprising:
a semiconductor die including a contact pad;
a redistribution layer formed over the semiconductor die, wherein the redistribution layer includes a top surface extending continuously from the contact pad over a surface of the semiconductor die to include an interconnect site of the redistribution layer outside the contact pad;
a first insulating layer formed over the top surface of the redistribution layer including an opening in the first insulating layer over the interconnect site of the redistribution layer with the first insulating layer contacting a side surface of the redistribution layer; and
an interconnect structure formed within the opening over the interconnect site of the redistribution layer and in contact with the side surface of the redistribution layer, wherein a width of opening is greater than a width of the interconnect structure.

11. The semiconductor device of claim 10, further including a second insulating layer formed over the semiconductor die, wherein the redistribution layer is formed over the second insulating layer.

12. The semiconductor device of claim 10, wherein the opening in the first insulating layer extends partially through the first insulating layer in an area adjacent to the redistribution layer.

13. The semiconductor device of claim 10, wherein the interconnect structure includes a bump.

14. A semiconductor device, comprising:
a semiconductor die including a contact pad;
a conductive layer formed over the semiconductor die, wherein the conductive layer includes a top surface extending from the contact pad over a surface of the semiconductor die to include an interconnect site of the conductive layer outside the contact pad;
a first insulating layer formed over the top surface of the conductive layer including an opening in the first insulating layer over the interconnect site of the conductive layer; and
an interconnect structure formed within the opening over the interconnect site of the conductive layer, wherein a first portion of the interconnect structure terminates on the top surface of the conductive layer and a second portion of the interconnect structure opposite the first portion contacts a side surface of the conductive layer.

15. The semiconductor device of claim 14, wherein a width of the opening is greater than a width of the interconnect structure.

16. The semiconductor device of claim 14, wherein the opening extends partially through the first insulating layer in an area adjacent to the conductive layer.

17. The semiconductor device of claim 16, wherein the first insulating layer contacts the side surface of the conductive layer.

18. The semiconductor device of claim 14, wherein the interconnect structure includes a bump.

19. The semiconductor device of claim 14, further including a second insulating layer formed over the semiconductor die, wherein the conductive layer is formed over the second insulating layer.

20. A semiconductor device, comprising:
a semiconductor die;
a redistribution layer formed over the semiconductor die, wherein the redistribution layer includes a top surface extending over a surface of the semiconductor die to include an interconnect site of the redistribution layer;
a first insulating layer formed over the redistribution layer and including an opening formed over the interconnect site with a width of the opening greater than a width of the interconnect site; and
an interconnect structure formed within the opening over the interconnect site of the redistribution layer, wherein a first portion of the interconnect structure terminates on the top surface of the redistribution layer and a second portion of the interconnect structure opposite the first portion contacts a side surface of the redistribution layer.

21. The semiconductor device of claim 20, wherein the opening in the first insulating layer extends partially through the first insulating layer in an area adjacent to the interconnect site.

22. The semiconductor device of claim 21, wherein the first insulating layer contacts the side surface of the redistribution layer.

23. The semiconductor device of claim 20, wherein the opening in the first insulating layer extends completely through the first insulating layer over the interconnect site.

24. The semiconductor device of claim 20, wherein the interconnect structure includes a bump.

25. The semiconductor device of claim 20, further including a second insulating layer formed over the semiconductor die, wherein the redistribution layer is formed over the second insulating layer.

26. The semiconductor device of claim 20, wherein a width of the opening is greater than a width of the interconnect structure.

* * * * *